(12) United States Patent
Ching et al.

(10) Patent No.: US 9,548,362 B2
(45) Date of Patent: Jan. 17, 2017

(54) HIGH MOBILITY DEVICES WITH ANTI-PUNCH THROUGH LAYERS AND METHODS OF FORMING SAME

(71) Applicant: Taiwan Semiconductor Manufacturing Company, Ltd., Hsin-Chu (TW)

(72) Inventors: Kuo-Cheng Ching, Zhubei (TW); Ka-Hing Fung, Zhudong Township (TW); Zhiqiang Wu, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/555,128

(22) Filed: Nov. 26, 2014

(65) Prior Publication Data

US 2016/0104776 A1 Apr. 14, 2016

Related U.S. Application Data

(60) Provisional application No. 62/062,598, filed on Oct. 10, 2014.

(51) Int. Cl.
*H01L 21/00* (2006.01)
*H01L 29/10* (2006.01)
*H01L 27/088* (2006.01)
*H01L 21/8234* (2006.01)
*H01L 29/66* (2006.01)

(52) U.S. Cl.
CPC ... *H01L 29/1083* (2013.01); *H01L 21/823431* (2013.01); *H01L 27/0886* (2013.01); *H01L 29/66545* (2013.01)

(58) Field of Classification Search
CPC ............ H01L 29/1083; H01L 27/0886; H01L 21/823431
See application file for complete search history.

(56) References Cited

U.S. PATENT DOCUMENTS

| | | | |
|---|---|---|---|
| 7,994,566 B2 | 8/2011 | Mouli | |
| 8,310,013 B2 | 11/2012 | Lin et al. | |
| 8,497,171 B1 * | 7/2013 | Wu | H01L 21/82382 438/199 |
| 8,610,201 B1 | 12/2013 | Hokazono | |
| 8,759,874 B1 | 6/2014 | Loubet et al. | |
| 2014/0061820 A1 | 3/2014 | Reznicek et al. | |

* cited by examiner

*Primary Examiner* — Laura Menz
(74) *Attorney, Agent, or Firm* — Slater Matsil, LLP

(57) ABSTRACT

An embodiment semiconductor device includes a fin extending upwards from a semiconductor substrate. The fin includes an anti-punch through (APT) layer having APT dopants and a channel region over the APT layer. The channel region is substantially free of APT dopants. The semiconductor device further includes a conductive gate stack on a sidewall and a top surface of the channel region.

20 Claims, 20 Drawing Sheets

HIGH MOBILITY DEVICES WITH ANTI-PUNCH THROUGH LAYERS AND METHODS OF FORMING SAME

PRIORITY CLAIM AND CROSS-REFERENCE

This application claims the benefit of U.S. Provisional Patent Application Ser. No. 62/062,598, filed on Oct. 10, 2014, and entitled "High Mobility Devices with Anti-Punch Through Layers and Methods of Forming Same," which application is incorporated herein by reference in its entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (finFETs) have been studied to overcome some of these problems.

In a typical finFET, a vertical fin structure is formed over a substrate. This vertical fin structure is used to form source/drain regions in the lateral direction and a channel region in the fin. A gate is formed over the channel region of the fin in the vertical direction forming a finFET. Subsequently, an inter-layer dielectric (ILD) and a plurality of interconnect layers may be formed over the finFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
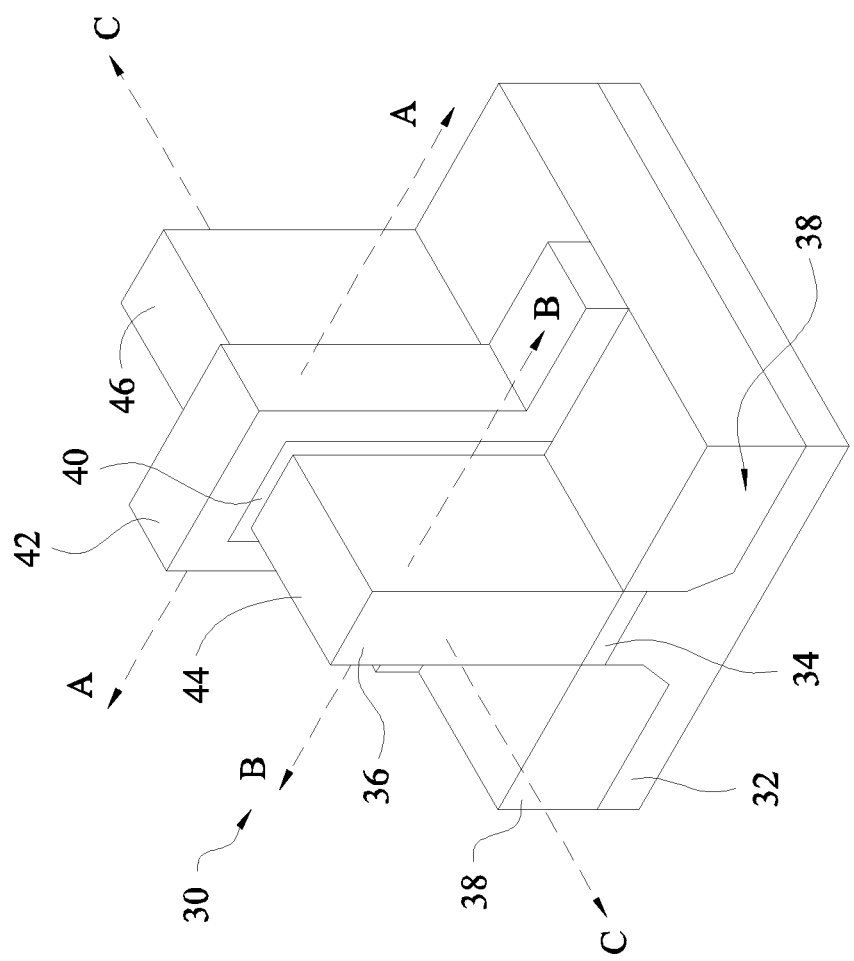
FIG. 1 is an example of a Fin Field-Effect Transistor (finFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include epitaxially growing an anti-punch through (APT) layer in a semiconductor substrate. The APT layer provides in-situ APT dopants, which may prevent punch through of n-type and p-type dopants from source/drain regions into underlying semiconductor layers of various finFET devices. Furthermore, the inclusion of the APT layer removes the need to perform APT implantation in at least devices of a first type (e.g., n-type or p-type) during the formation of such finFET devices, which may result in undoped channel regions and improved electrical functionality. APT dopant implantation may still be performed to form devices of a second type (e.g., the other of n-type or p-type) in the wafer.

FIG. 1 illustrates an example of a finFET 30 in a three-dimensional view. FinFET 30 includes a fin 36 on a substrate 32. Substrate 32 includes isolation regions 34, and fin 36 protrudes above and from between neighboring isolation regions 38. Substrate 32 may further include an APT layer 34, which may be used to in-situ dope various regions of finFET 30 with APT dopants. A gate dielectric 40 is along sidewalls and over a top surface of fin 36, and a gate electrode 42 is over gate dielectric 40. Portions of fin 36 covered by gate dielectric 38/gate electrode 42 may be referred to as a channel region of finFET 30. Source/drain regions 44 and 46 are disposed in opposite sides of fin 36 with respect to the gate dielectric 40 and gate electrode 42. FIG. 1 further illustrates reference cross-sections that are used in later figures. Cross-section A-A is across a channel, gate dielectric 40, and gate electrode 42 of finFET 30. Cross-section B-B is across a source/drain region 44 or 46 of the finFET 30. Cross-section C-C is perpendicular to cross-section A-A and is along a longitudinal axis of fin 36 and in a direction of, for example, a current flow between the source/drain regions 44 and 46. Subsequent figures refer to these reference cross-sections for clarity.

Figure 2:
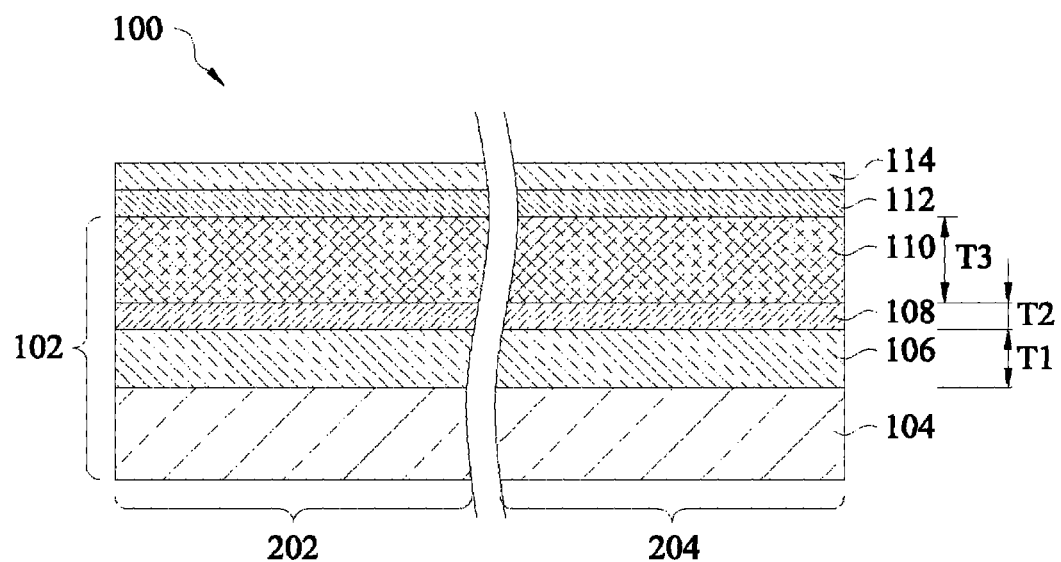
FIGS. 2 through 17C illustrate cross-sectional views of intermediary stages of the manufacturing a finFET in accordance with some embodiments.
Figure 3:
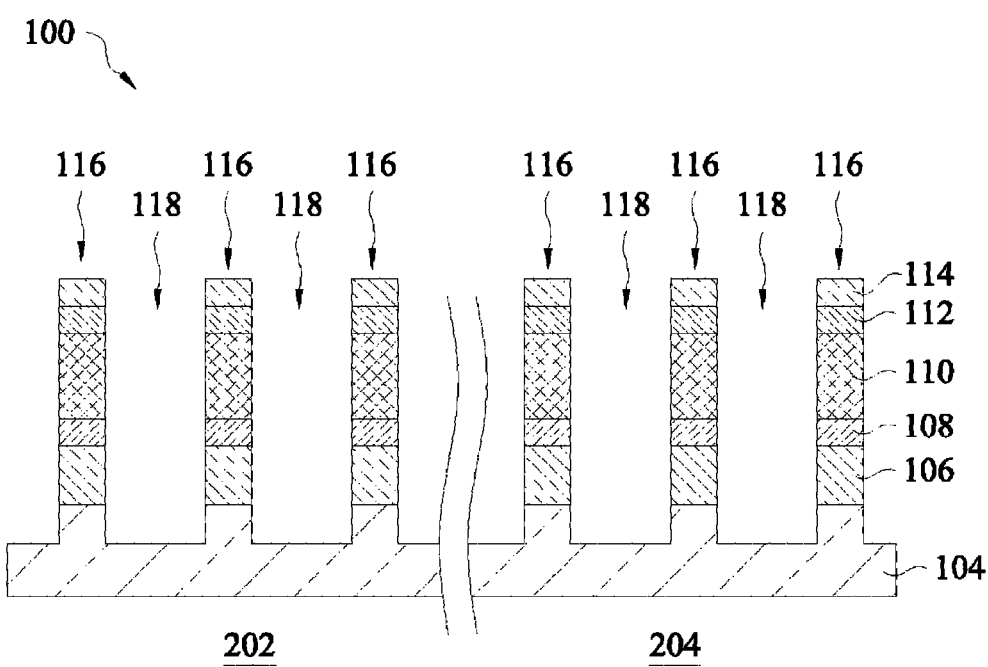
Figure 17A:
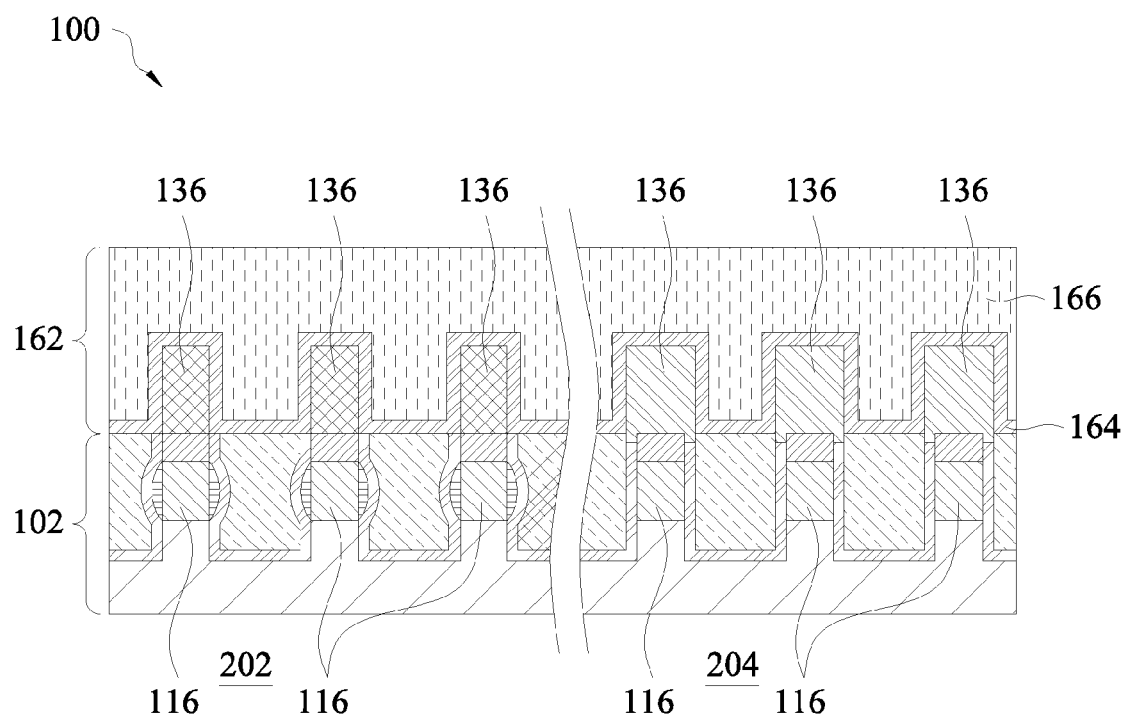
Figure 17B:
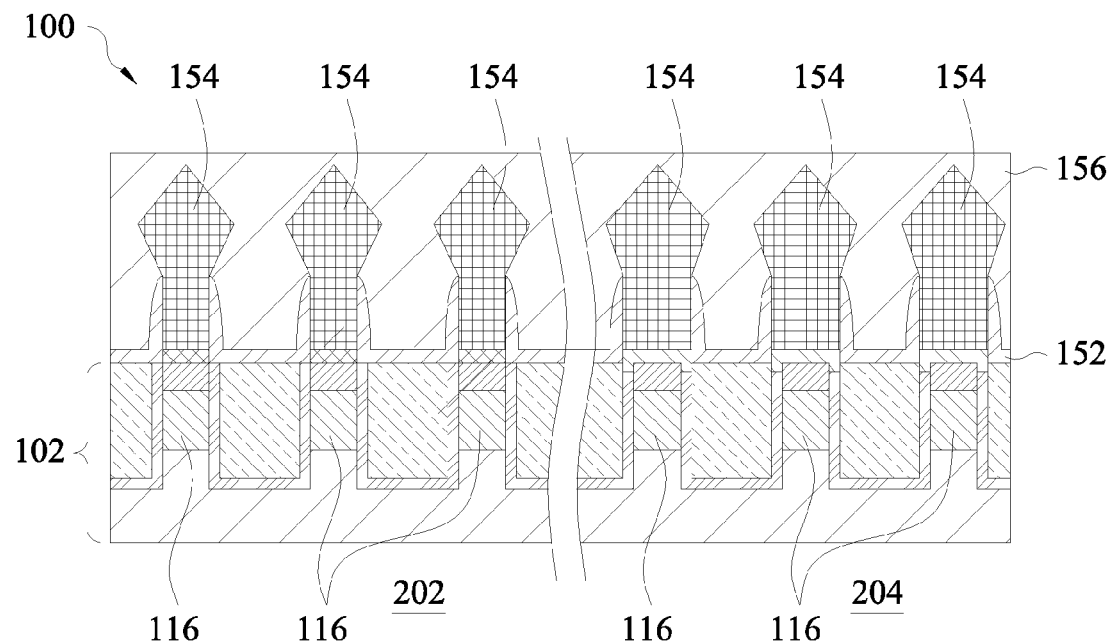
Figure 17C:
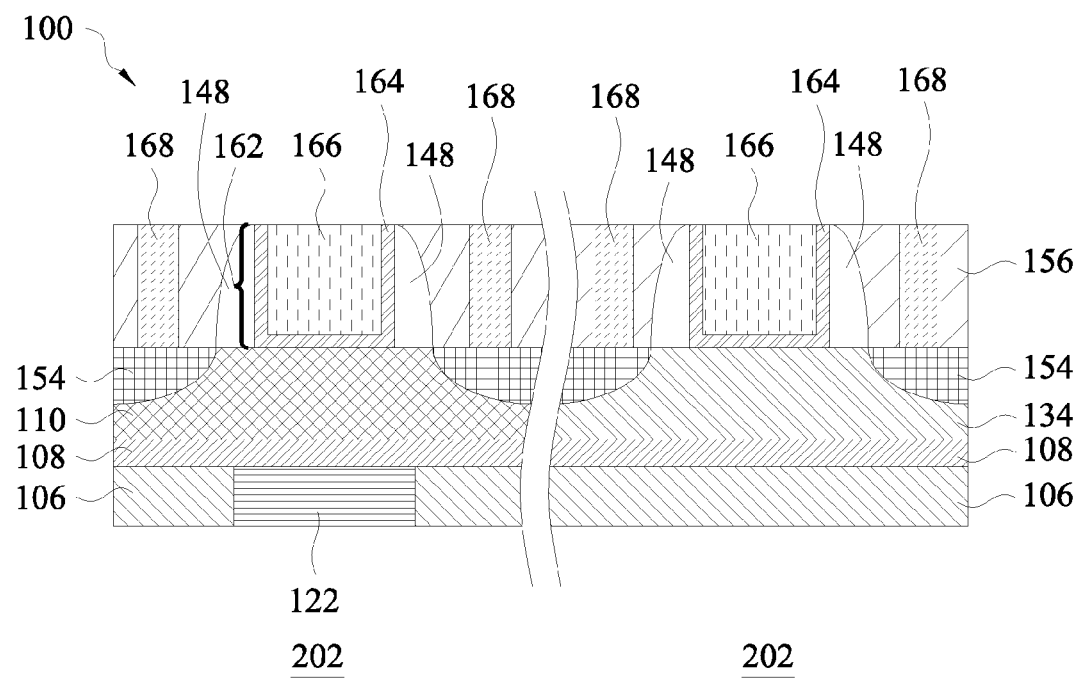
Figure 18:
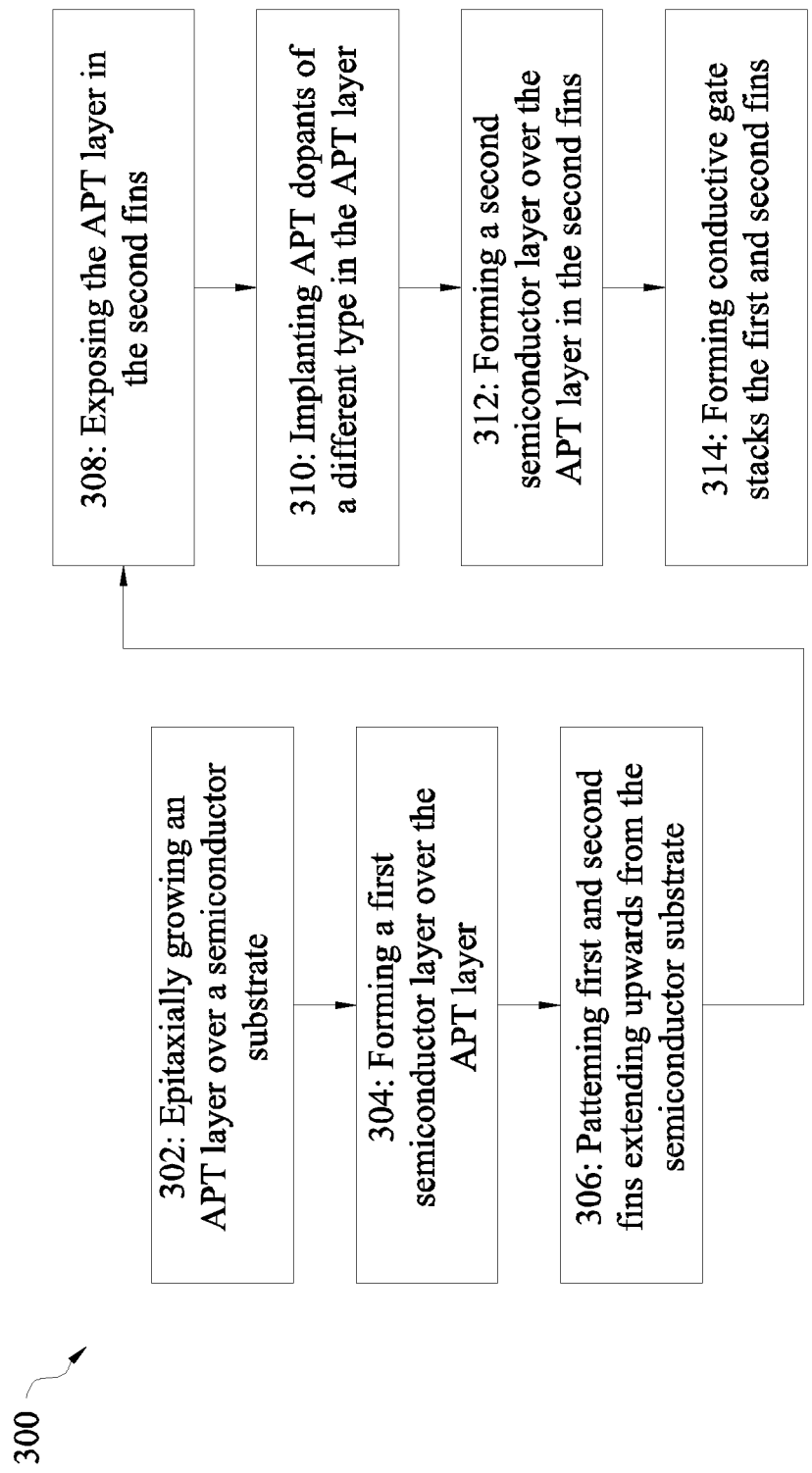
FIG. 18 illustrates a flow diagram of a method for manufacturing a finFET in accordance with some embodiments.

FIGS. 2 through 17C are cross-sectional views of various intermediary stages in the manufacturing of finFETs in accordance with various embodiments, and FIG. 18 is a process flow of the process shown in FIGS. 2 through 17C. FIGS. 2 and 3 illustrate reference cross-section A-A illustrated in FIG. 1, except for multiple finFETs and/or finFETs having multiple fins. As discussed above, in FIGS. 4A through 17C, figures ending with an "A" designation are illustrated along a similar cross-section A-A; figures ending with a "B" designation are illustrated along a similar cross-section B-B; and figures ending with a "C" designation are illustrated along a similar cross-section C-C.

FIGS. 2 and 3 illustrate the formation of semiconductor fins extending upwards from a substrate. Referring first to FIG. 2, a wafer 100 having a substrate 102 is illustrated. Substrate 102 includes an n-channel metal-oxide-semiconductor (NMOS) region 202 for forming NMOS finFET devices and a p-channel metal-oxide-semiconductor (PMOS) region 204 for forming PMOS finFET devices. Regions 202 and 204 may or may not be contiguous and any number of device features (e.g., isolation regions, dummy features, or the like, not shown) may be formed between NMOS region 202 and PMOS region 204 depending on device design.

As illustrated, substrate 102 is a multilayer substrate comprising various substrate layers 104, 106, 108, and 110. Base substrate layer 104 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate layer 104 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As further illustrated by FIG. 2, additional substrate layers 106, 108, and 110 may be formed over base substrate layer 104. In some embodiments, various epitaxies may be performed to form various substrate layers 106, 108, and 110. Any suitable epitaxy processes may be used, such as by metal-organic (MO) chemical vapor deposition (CVD), molecular beam epitaxy (MBE), liquid phase epitaxy (LPE), vapor phase epitaxy (VPE), selective epitaxial growth (SEG), combinations thereof, or the like.

Substrate layers 106 and 110 are disposed over base substrate layer 104 with substrate layer 110 being disposed over substrate layer 106. In some embodiments, substrate layer 106 has a thickness T1 of about 20 nm to about 90 nm, and substrate layer 110 may have a thickness T3 of about 20 nm to about 60 nm. Substrate layers 106 and 110 may be lattice mix-matched to produce a desired strain and/or electrical characteristic in the resulting finFET devices. In some embodiments, this lattice mix-match may be achieved by selecting differing atomic percentages of germanium for layers substrate 106 and 110. For example, when substrate layer 110 has a lower atomic percentage of Ge than underlying substrate layer 106, tensile strain may be achieved, which is beneficial for NMOS devices. Thus, in various embodiments substrate layer 110 may comprise bulk Si while substrate layer 106 comprises SiGe to produce tensile strain. However, for PMOS devices, compressive strain may be beneficial, which can be achieved when substrate layer 106 has a lower atomic percentage of Ge than substrate layer 110. Thus, in subsequent process steps (see e.g., FIGS. 10A and 10B), substrate layer 110 in PMOS region 204 may be replaced with a SiGe layer having a higher atomic percentage of Ge than underlying substrate layer 106.

Furthermore, an atomic percentage of Ge in substrate layer 106 may vary in different regions (e.g., NMOS region 202 or PMOS region 204) of substrate 102 to produce a desired type of strain and/or to produce a desired electronic characteristic. For example, substrate layer 106 in NMOS region 202 may comprise SiGe having a relatively high atomic percentage of Ge, for example, of about 30% to about 80%. In contrast, substrate layer 106 in PMOS region 204 may comprise SiGe having a lower atomic percentage of Ge. In such embodiments, substrate layer 106 in PMOS region 204 may comprise SiGe having an atomic percentage of Ge of about 20% to about 45%, for example. Furthermore, in some embodiments, APT layer 108 may be sufficiently thin to not affect the strain induced in the resulting finFET devices. For example, APT layer may have a thickness of about 3 nm to about 10 nm.

An anti-punch through (APT) layer 108 is disposed between substrate layers 106 and 110. In some embodiments, APT layer 108 may be a semiconductor layer comprising APT dopants suitable for preventing source/drain punch through in n-type devices. For example, APT layer 108 may comprise silicon carbon boron (SiCB), silicon boron (SiB), and the like. A concentration of n-type APT dopants (e.g., boron) in APT layer 108 may be about $1 \times 10^{18}/cm^3$ to about $3 \times 10^{18}/cm^3$, for example. In embodiments when APT layer 108 comprises SiCB, the carbon atoms may prevent (or at least reduce) the diffusion of APT dopants (e.g., boron) into surrounding device layers. In such embodiments, an atomic concentration of C in APT layer 108 may be about 0.5% to about 1%. Furthermore, APT layer 108 may have a thickness T2 of about 3 nm to about 10 nm. By epitaxially growing an APT layer 108 in substrate 102 directly, traditional implantation of APT dopants may be avoided at least for devices in NMOS region 202. For example, overlying substrate layer 110 may be substantially free of any dopants, and APT dopant implantation may not be performed on substrate layer 110 even in subsequent process steps. The resulting NMOS finFETs may include substantially undoped channel regions, improving electrical performance and/or characteristics of the resulting device.

As further illustrated by FIG. 2, hard mask 112 and photoresist 114 may be disposed over substrate 102. Hard mask 112 may comprise one or more oxide (e.g., silicon oxide) and/or nitride (e.g., silicon nitride) layers to prevent damage to the underlying substrate 102 during patterning. Hard mask 112 may be formed using any suitable deposition process, such as, atomic layer deposition (ALD), chemical vapor deposition (CVD), high density plasma CVD (HDP-CVD), physical vapor deposition (PVD), and the like. Photoresist 114 may comprise any suitable photosensitive material blanket deposited using a suitable process, such as, spin on coating, and the like.

FIG. 3 illustrates the patterning of substrate 102 to form fins 116 disposed between adjacent trenches 118. In an example embodiment, photoresist 114 may first be patterned by exposing photoresist 114 to light using a photomask. Exposed or unexposed portions of photoresist 114 may then be removed depending on whether a positive or negative resist is used.

The pattern of photoresist 114 may then be transferred to hard mask 112 (e.g., using a suitable etching process). Subsequently, trenches 118 are patterned into underlying substrate 102 using hard mask 112 as a patterning mask during an etching process, for example. The etching of substrate 102 may include acceptable etch processes, such as a reactive ion etch (RIE), neutral beam etch (NBE), the like, or a combination thereof. The etching may be anisotropic. Subsequently, photoresist 112 is removed in an ashing and/or wet strip processes, for example. Hard mask 112 may also be removed. Thus, fins 116 are formed in wafer 100. Fins 116 extend upwards base substrate layer 104 between adjacent trenches 118.

Figure 4A:
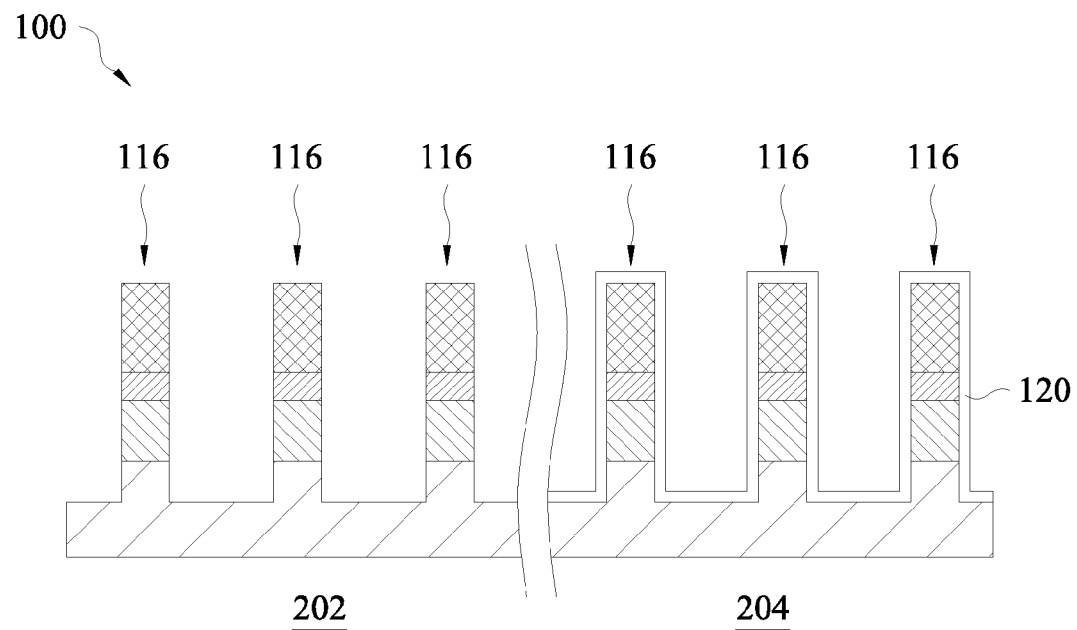
Figure 4B:
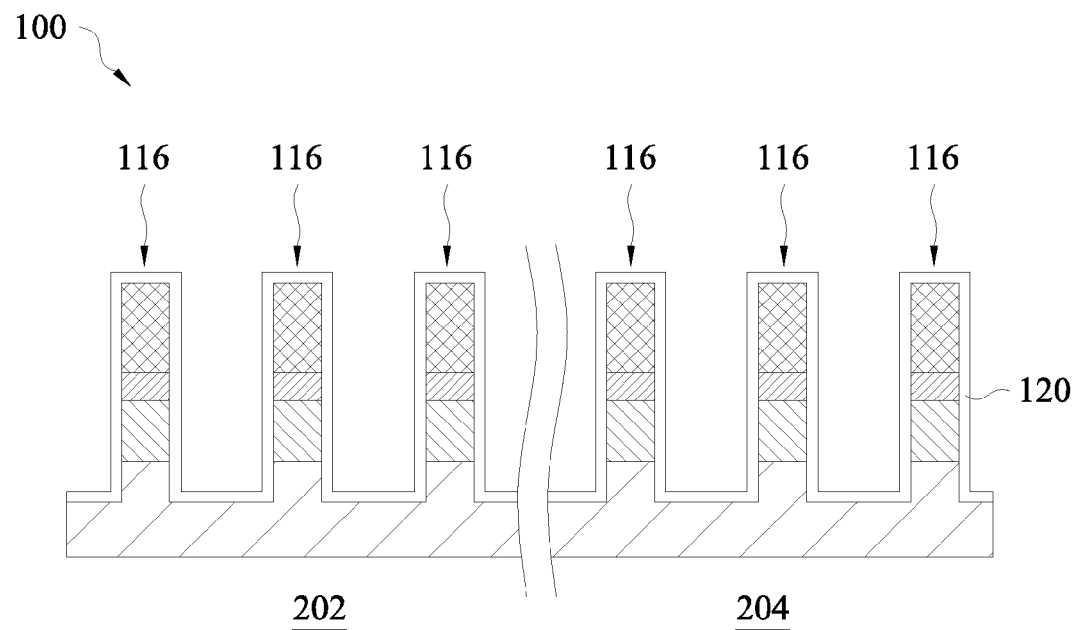

FIGS. 4A through 5B illustrate the optional formation of tensile strain producing features (e.g., dielectric layer 122, see, e.g., FIG. 5A) on fins 116 in NMOS region 202. Referring to FIGS. 4A and 4B, a hard mask 120 is formed over portions of wafer 102. Again, FIG. 4A illustrates a cross-section of wafer 100 across a channel region (cross-section A-A of FIG. 1), whereas FIG. 4B illustrates a cross-section of wafer 100 at the same stage of manufacture across a source/drain region (cross-section B-B of FIG. 1). As illustrated, hard mask 120 covers top surfaces and sidewalls of fins 116 in PMOS region 204 and source/drain regions of fins 116 in NMOS region 202. However, hard mask 120 is patterned to expose channel regions of fins 116 in NMOS region 202. Hard mask 120 may comprise any suitable dielectric material (e.g., a nitride or oxide), which may be patterned using a combination of photolithography and etching, for example.

Figure 5A:
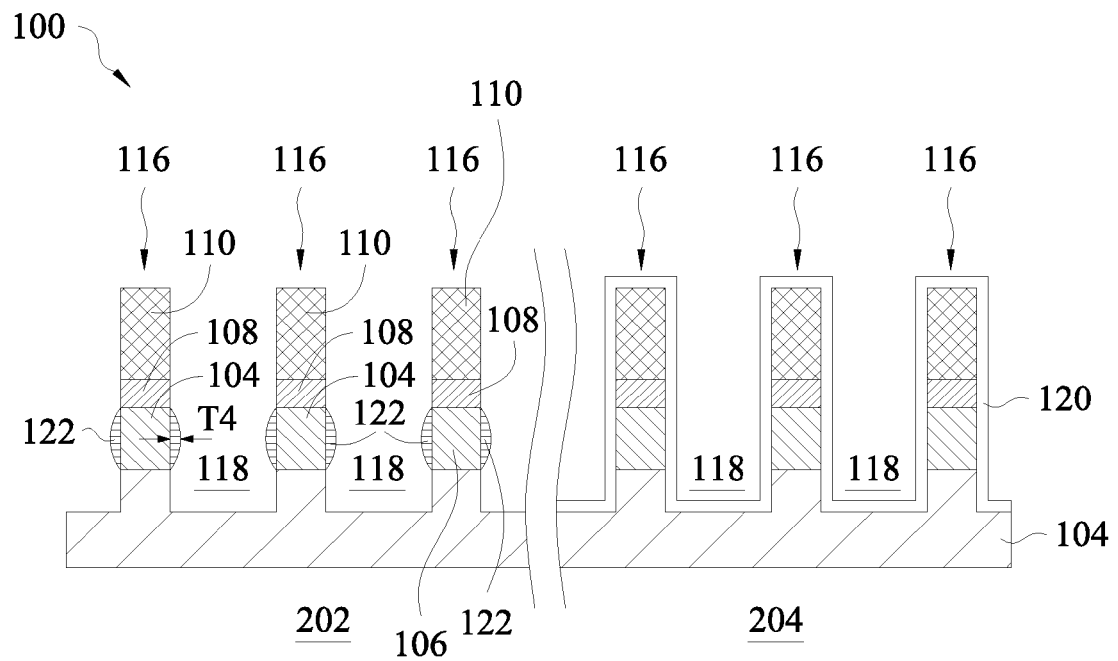
Figure 5B:
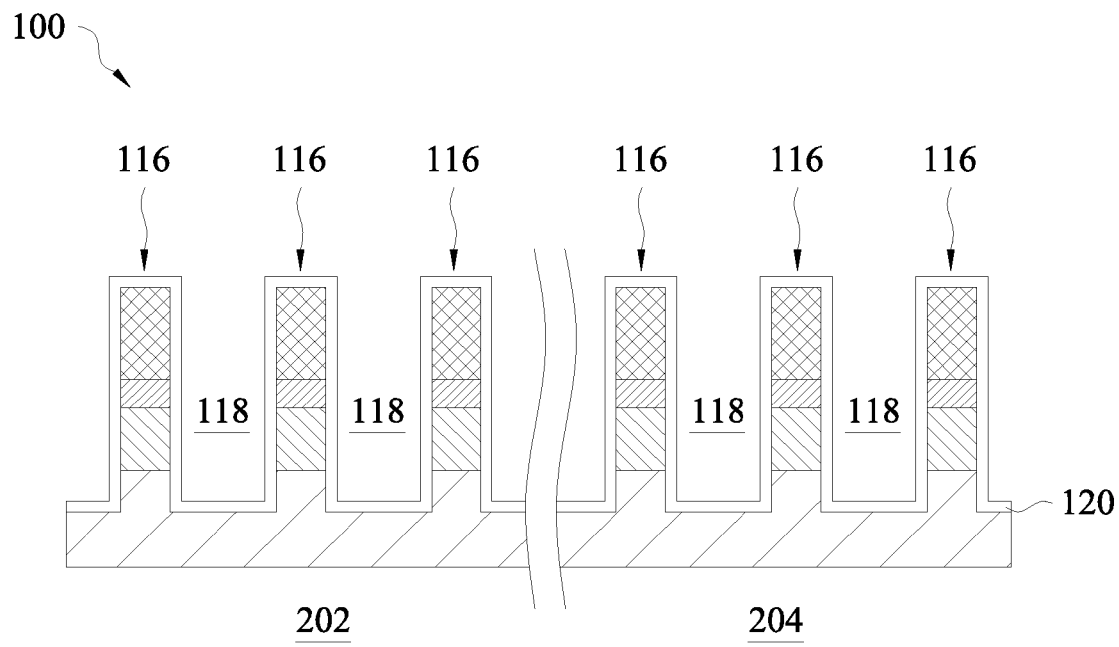

FIGS. 5A and 5B illustrate the formation of dielectric layer 122 on portions of fins 116 in NMOS region 202. Dielectric layer 122 may be formed by oxidizing substrate layer 106 in NMOS region 202. In such embodiments, dielectric layer 122 may comprise a semiconductor oxide (e.g., SiGe oxide). Any suitable oxidation process may be used, such as a wet oxidation process that selectively oxidizes the Ge within substrate layer 106 without oxidizing other semiconductor materials (e.g., bulk Si, SiB, or SiCB) of substrate layers 104, 108, or 110. In some example embodiments, the wet oxidation process may include maintaining wafer 100 at a temperature of about 400° C. and about 500° C. while pure water vapor is supplied to wafer 100 in an environment maintained at about 1 Atm of pressure for between about thirty minutes and about one hour. The resulting dielectric layer 122 may have a thickness T4 (at a thickest point) of about 3 nm to about 10 nm, for example. Other suitable oxidation processes may also be used.

The oxidation process forms dielectric layer 122 within trenches 118 of a channel region in NMOS region 202. Dielectric layer 122 may produce tensile strain in fins 116 on which dielectric layer 122 is formed. The resulting tensile strain may be more desirable for channel regions of NMOS devices. Thus, the formation of dielectric layer 122 may be confined to channel regions of NMOS region 202, and dielectric layer 122 may not be formed in PMOS region 204 or under source/drain regions in NMOS region 202. The selective formation of dielectric layer 122 may be facilitated by the configuration of hard mask 120. For example, hard mask 120 may mask fins 116 in PMOS region 204 and in source/drain regions of fins 116 in NMOS region 202 during the oxidation process. After the formation of dielectric layer 122, hard mask 120 may be removed.

Figure 6A:
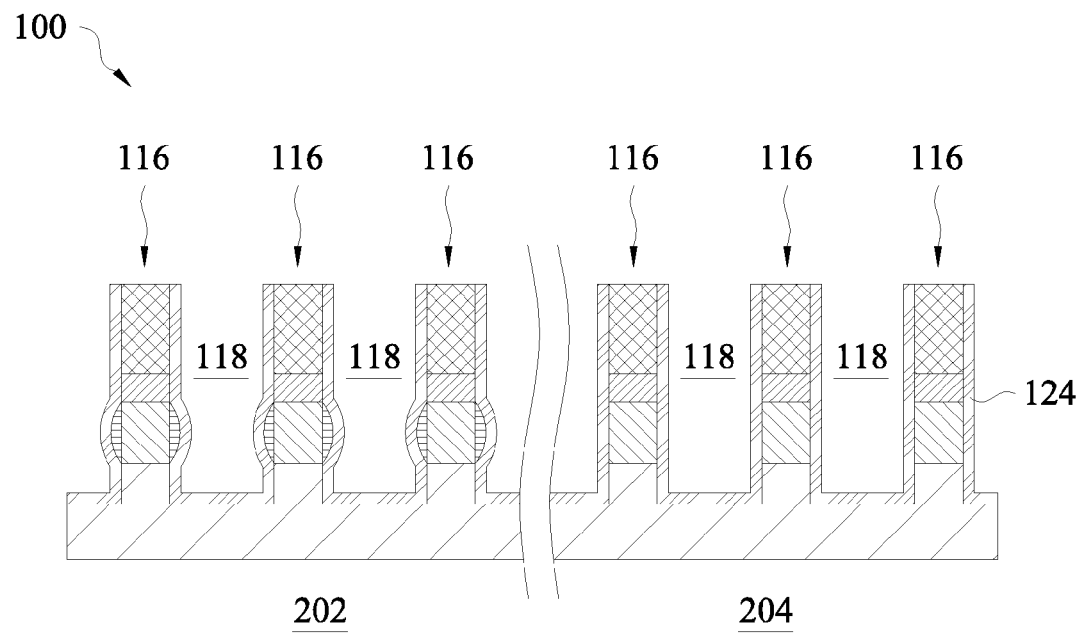
Figure 6B:
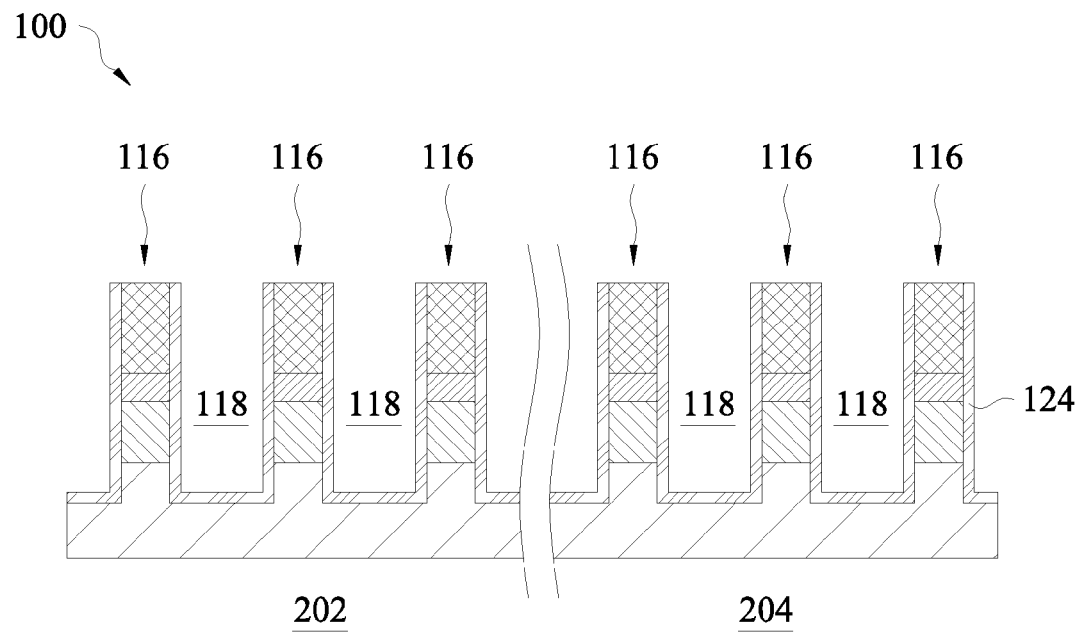

Referring next to FIGS. 6A and 6B, a liner 124, such as a diffusion barrier layer, may be disposed along sidewalls of bottom surfaces of trenches 118. In some embodiments, liner 124 may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of liner 124 may include any suitable method, such as, atomic layer deposition (ALD), CVD, high density plasma (HDP) CVD, physical vapor deposition (PVD), and the like.

Figure 7A:
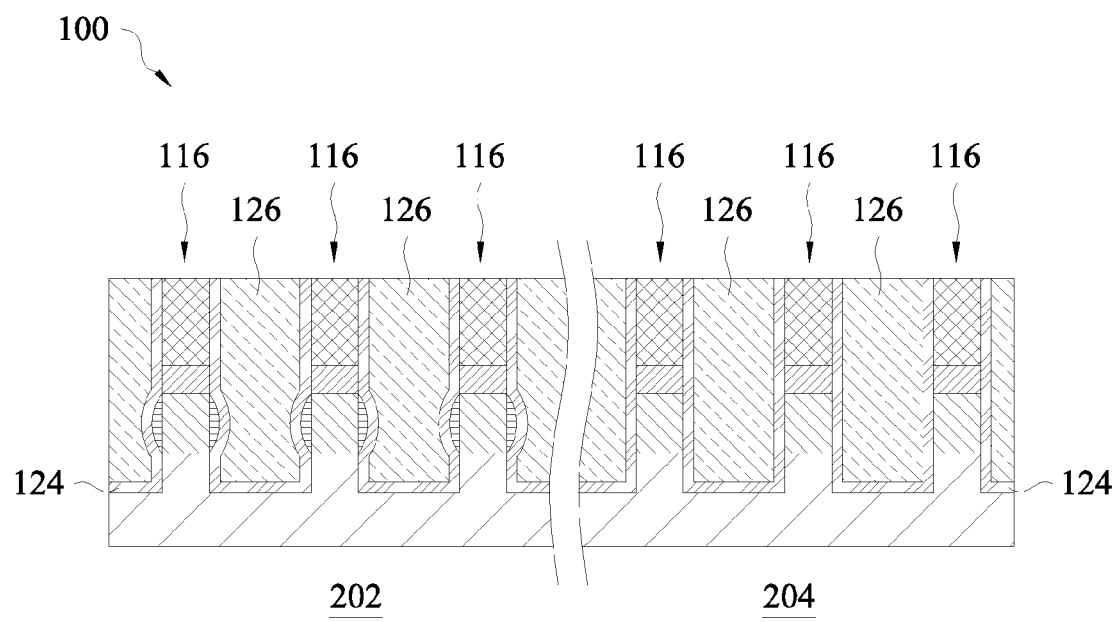
Figure 7B:
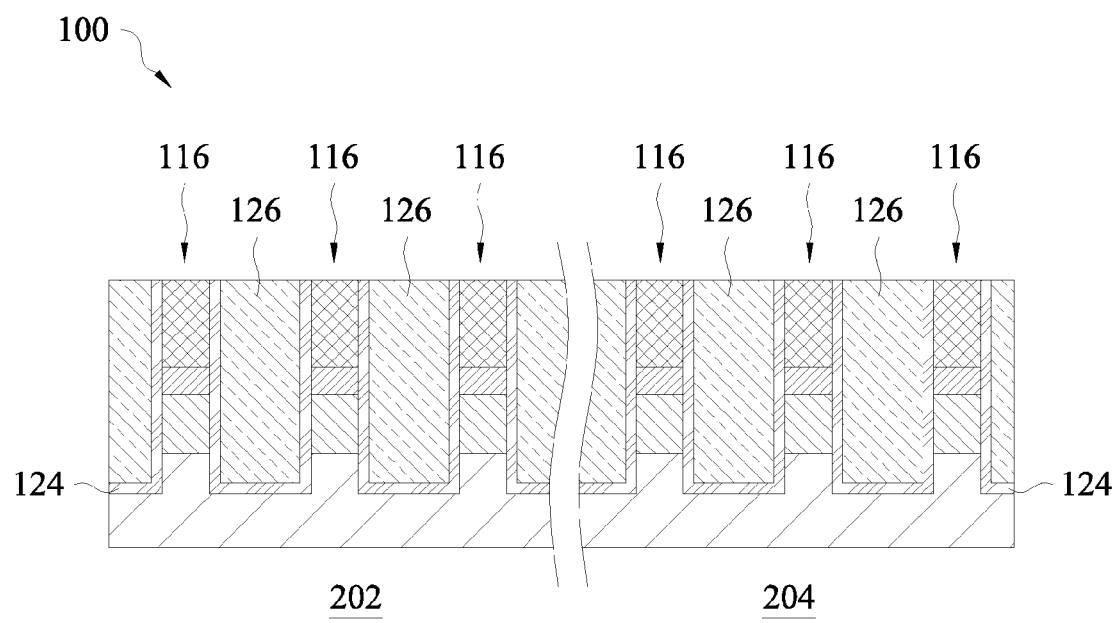

In FIGS. 7A and 7B, trenches 118 may be filled with a dielectric material, such as, silicon oxide, or the like. In some embodiments, the resulting STI regions 126 may be formed using a high-density-plasma (HDP) CVD process, using silane ($SiH_4$) and oxygen ($O_2$) as reacting precursors. In other embodiments, STI regions 126 may be formed using a sub-atmospheric CVD (SACVD) process or high aspect-ratio process (HARP), wherein process gases may comprise tetraethylorthosilicate (TEOS) and ozone ($O_3$). In yet other embodiments, STI regions 126 may be formed using a spin-on-dielectric (SOD) process, such as hydrogen silsesquioxane (HSQ) or methyl silsesquioxane (MSQ). An annealing (or other suitable process) may be performed to cure the material of STI regions 126, and liner 124 may prevent (or at least reduce) the diffusion of semiconductor material from fins 116 (e.g., Si and/or Ge) into the surrounding STI regions 126 during the annealing. Other processes and materials may be used. A chemical mechanical polish (CMP) or etch back process may be used to level a top surfaces of STI regions 126, liner 124, and fins 116.

Figure 8A:
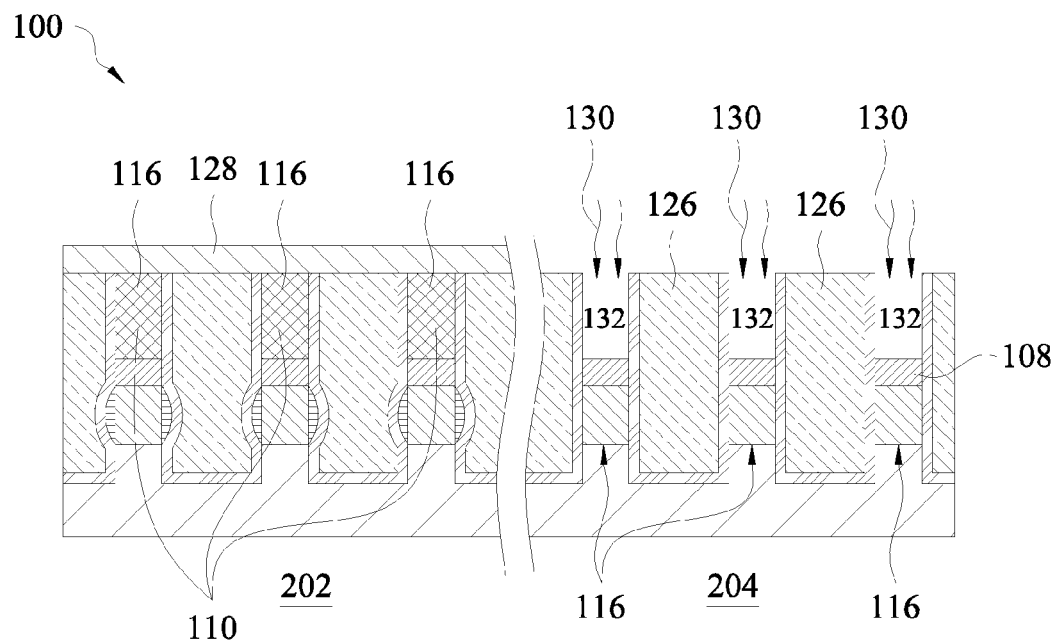

FIGS. 8A through 10B illustrate the replacement of semiconductor layer 110 with a semiconductor layer 134 (e.g., having a higher atomic percentage of Ge) in PMOS region 204. FIGS. 8A and 8B illustrates the removal of top portions (e.g., semiconductor layer 110 portions) of fins 116 in PMOS region 204. In some embodiments, NMOS region 202 may be masked (e.g., by a hard mask 128) during the removal of semiconductor layer 110 in PMOS region 204. Thus, PMOS region 204 may be selectively processed without affecting the features of NMOS region 202. The removal of semiconductor layer 110 in PMOS region 204 may include any suitable process, such as, dry etching, wet etching, RIE, and the like. The removal of semiconductor layer 110 portions defines trenches 132 between neighboring STI regions 126, and such trenches 132 may expose APT layer 108 in PMOS region 204.

Figure 8B:
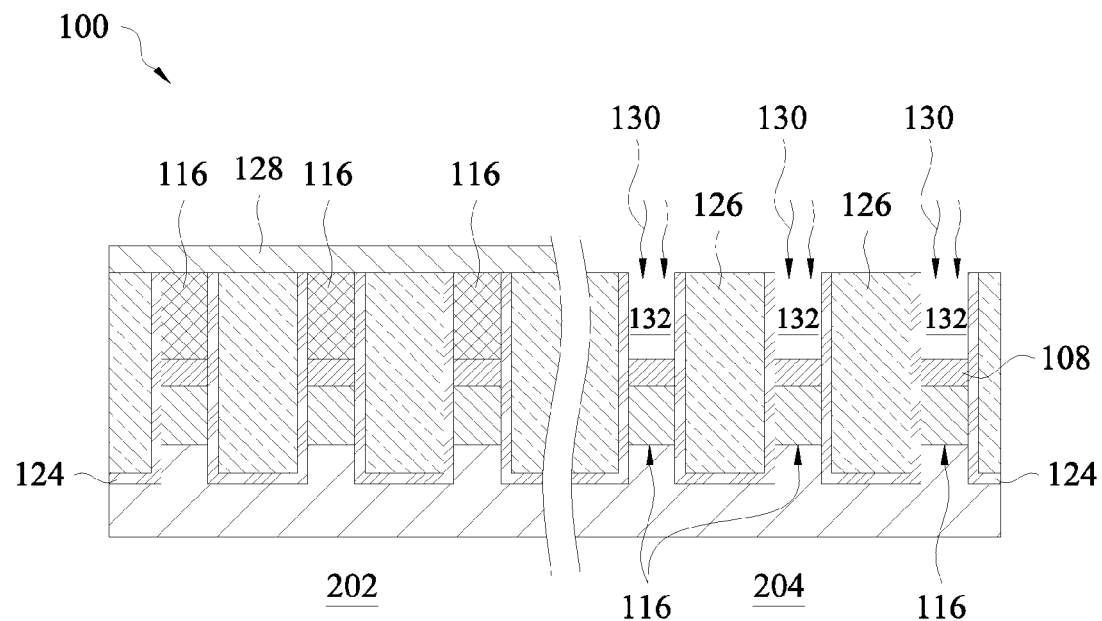

As further illustrated by FIGS. 8A and 8B, after exposing APT layer 108 in PMOS region 204, an APT dopant implantation process may be performed (indicated by arrows 130). The APT dopant implantation process may implant p-type APT dopants in exposed APT layer 108. In some embodiments, the APT dopants implanted may be suitable for preventing source/drain punch through in p-type devices. For example, the p-type APT dopants used may include phosphorous, and the like.

In some embodiments, p-type APT dopants may be implanted at a suitably high concentration to suppress the n-type APT dopants (e.g., boron) originally found in APT layer 108. For example, a ratio of the concentration of implanted p-type APT dopants (e.g., phosphorous) to n-type APT dopants (e.g., boron) may be at least about two to one. As a further example, in embodiments when a concentration of n-type APT dopants (e.g., boron) in APT layer 108 may be about $1\times10^{18}/cm^3$ to about $3\times10^{18}/cm^3$, a concentration of p-type APT dopants (e.g., phosphorous) implanted in APT layer 108 may be about $2\times10^{18}/cm^3$ to about $6\times10^{18}/cm^3$. After implantation, the resulting APT layer 108 in PMOS region 204 (labeled 108P in FIGS. 9A and 9B) may comprise silicon carbon boron phosphorous (SiCBP), silicon boron phosphorous (SiBP), and the like. During p-type APT dopant implantation, NMOS region 202 may be masked, and thus, portions of fins 116 (e.g., substrate layer 110) in NMOS region 202 may remain substantially undoped even after implantation.

Figure 9A:
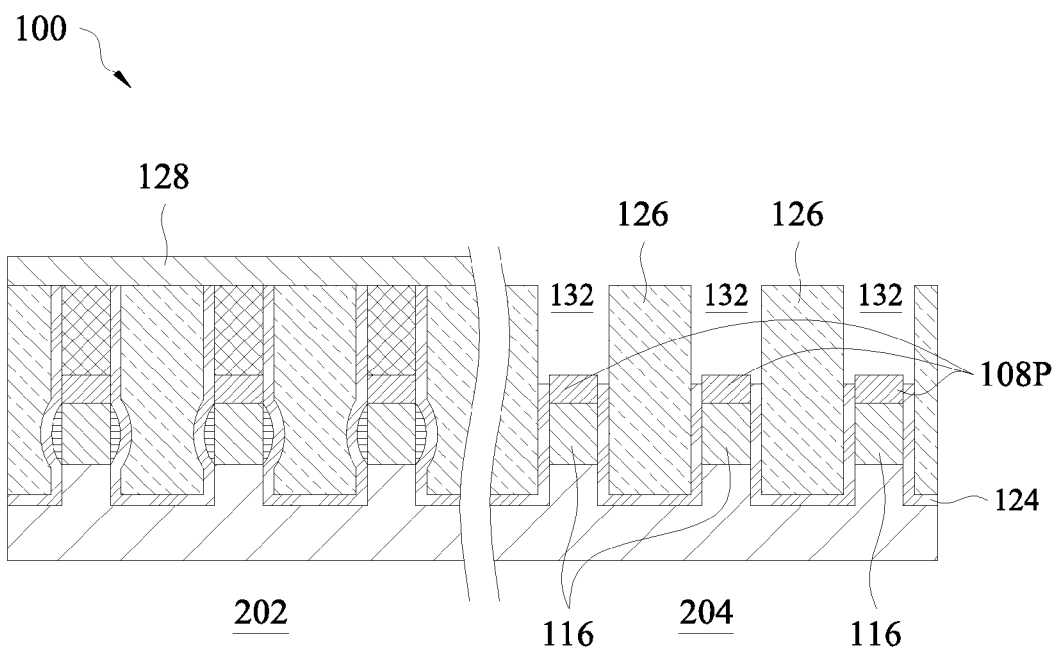
Figure 9B:
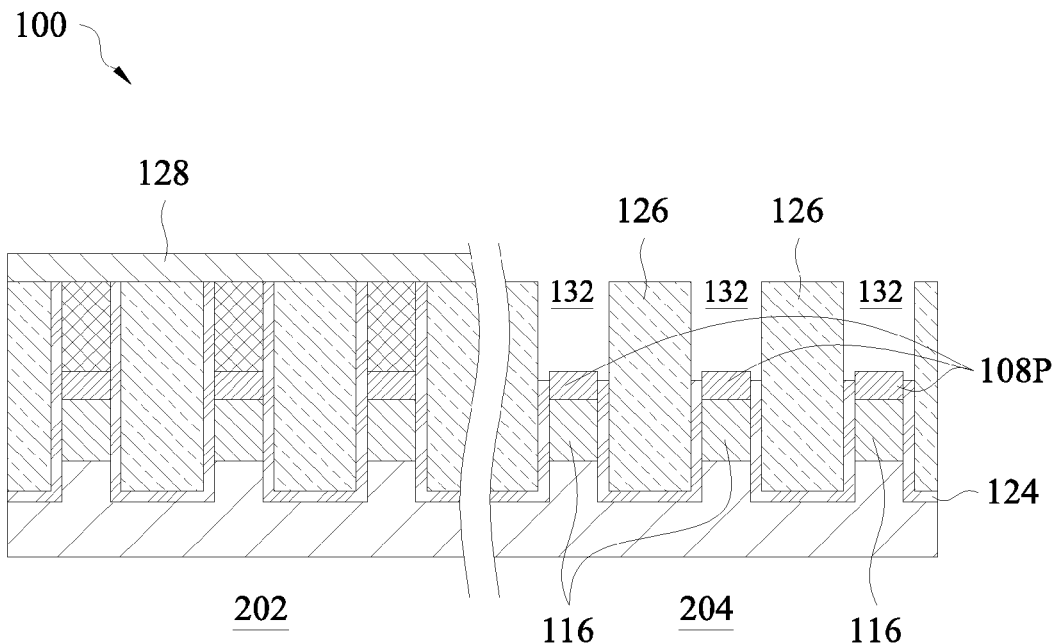

FIGS. 9A and 9B illustrate the optional recessing of liner 124 in PMOS region 204. The recessing of liner 124 may include any suitable process, such as, dry etching, wet etching, RIE, and the like. Liner 124 may be recessed from a top surface of APT layer 108P in PMOS region 204. In subsequent process steps (e.g., in FIGS. 10A and 10B), semiconductor layer 134 may be grown in trenches 132. In embodiments where liner 124 is recessed past APT layer 108P, semiconductor layer 134 may be grown on multiple surfaces of APT layer 108P (e.g., a lateral top surface and sidewall surfaces). This increased bonding area may reduce the occurrence of voids and other interface defects at the interface between APT layer 108P and semiconductor layer 134.

Figure 10A:
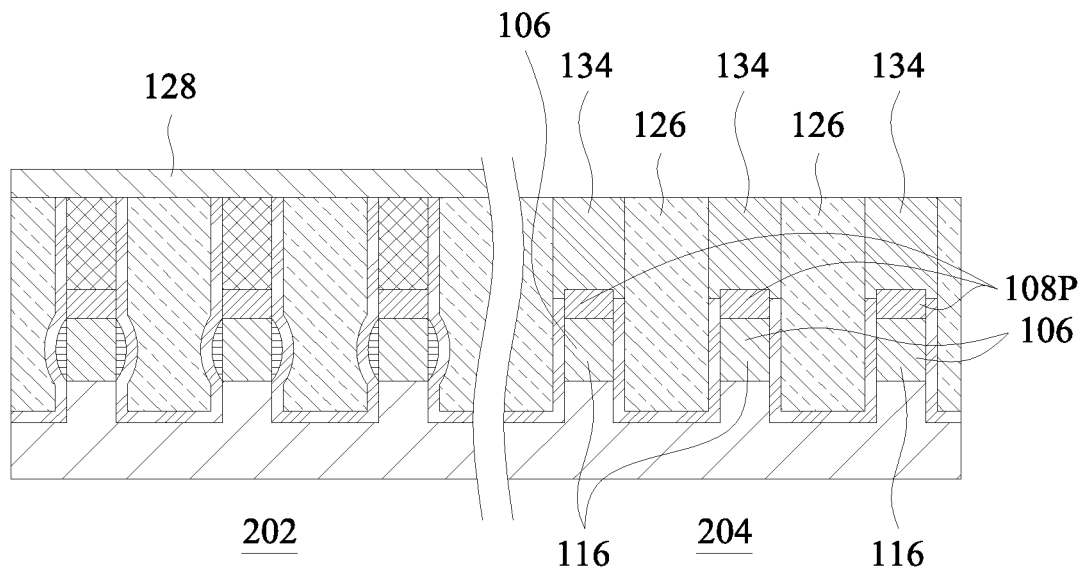
Figure 10B:
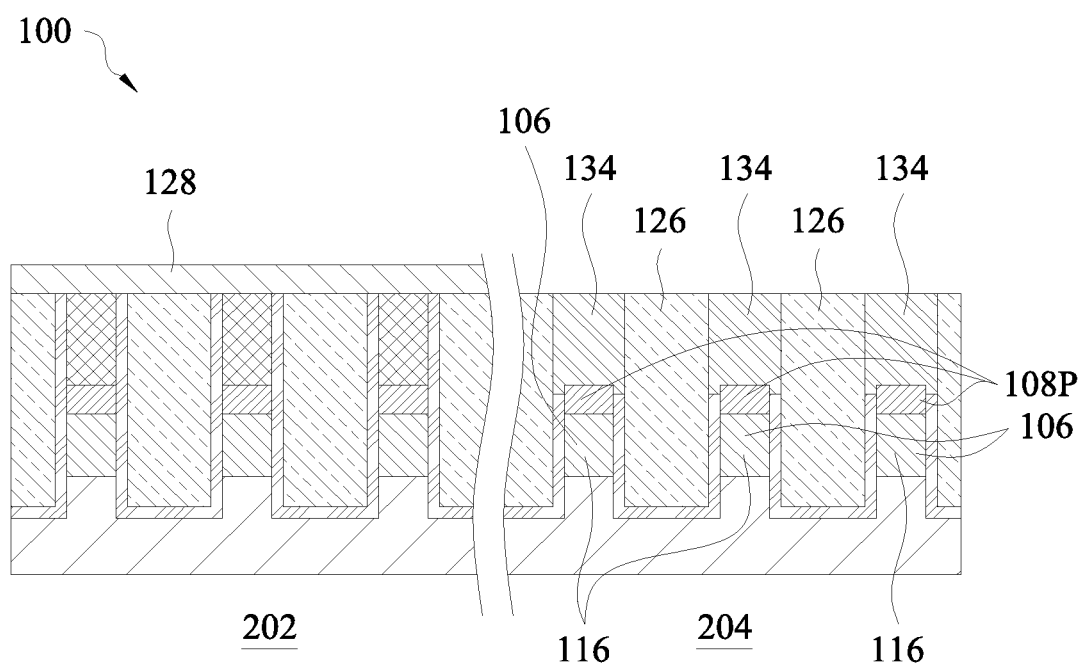

Subsequently, in FIGS. 10A and 10B, an epitaxy is performed to epitaxially grow semiconductor layer 134 in trenches 132. In various embodiments, semiconductor layer 134 may be lattice mix-matched with underlying substrate layer 106 to achieve compress strain, which may be beneficial for p-type devices. For example, semiconductor layer 134 may include a higher atomic percentage of Ge than underlying substrate layer 106. In such embodiments, substrate layer 106 may comprise SiGe having an atomic percentage of Ge of about 20% to about 45% while semiconductor layer 134 may comprise SiGe or Ge having an atomic percentage of Ge of about 45% to about 100%. The epitaxy of semiconductor layer 134 may overgrow a top surface of STI regions 126, and a planarization technique (e.g., a chemical mechanical process (CMP)) may be performed to level a top surface of semiconductor layer 134 with STI regions 126. Furthermore, the material of semiconductor layer 134 (e.g., SiGe or Ge) may provide improved electrical characteristic (e.g., improved mobility) in channel regions of the resulting p-type device. In some embodiments, after formation, semiconductor layer 134 may include dopants (e.g., p-type APT dopants) at a concentration of about $2 \times 10^{17}/cm^3$ to about $2 \times 10^{18}/cm^3$, which may be formed in semiconductor layer 134 due to the epitaxy of semiconductor layer 134 over APT layer 108P. However, even in such embodiments, semiconductor layer 110 may remain undoped because of hard mask 128. After the epitaxy of semiconductor layer 134, hard mask 128 may be removed.

Figure 11A:
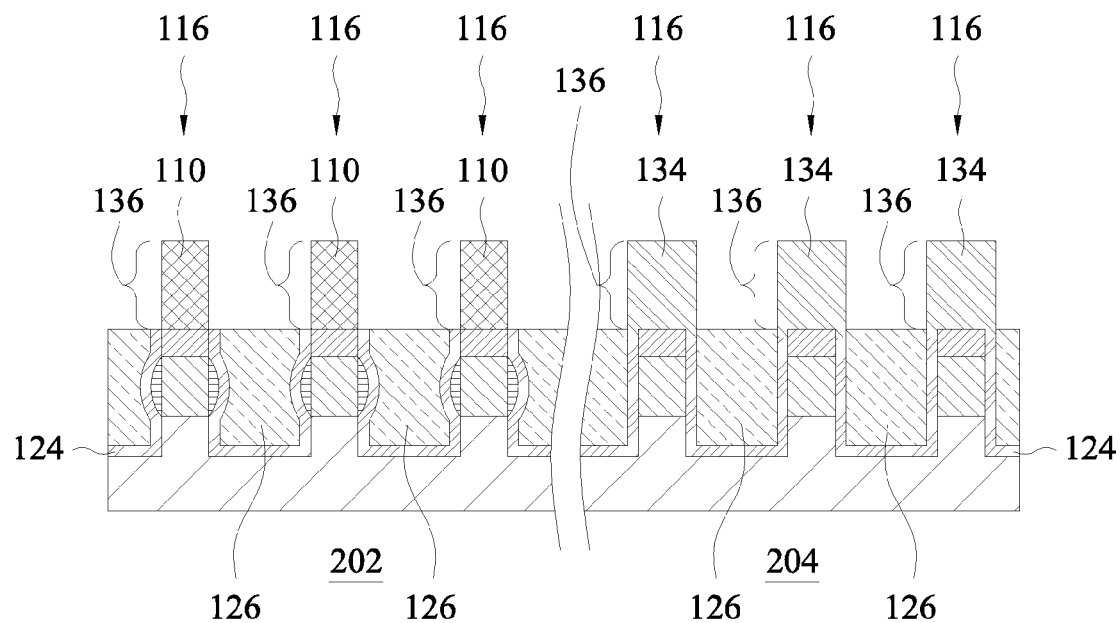
Figure 11B:
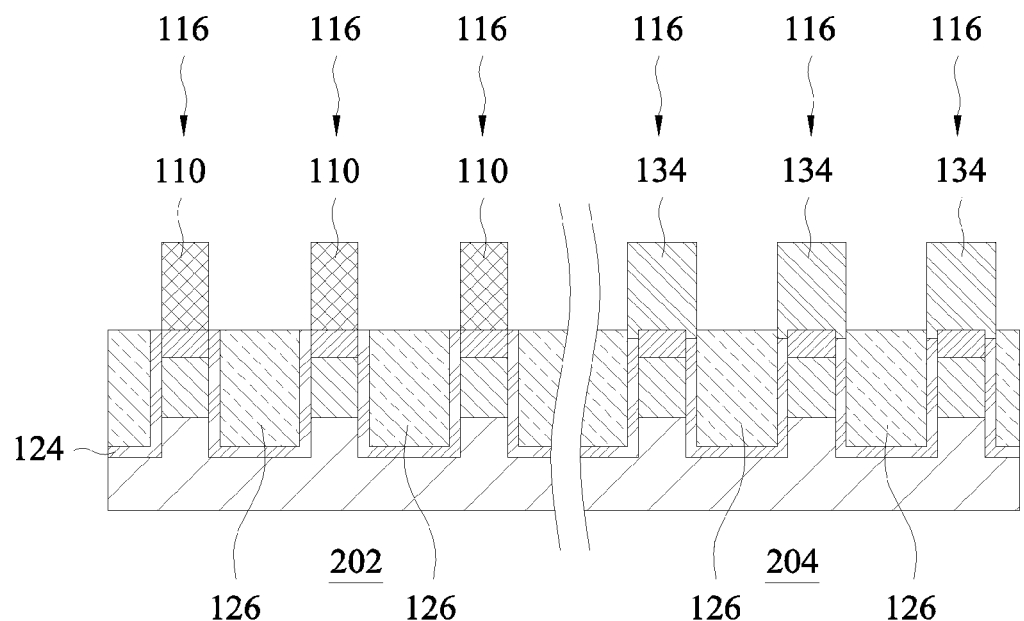

In FIGS. 11A and 11B, STI regions 126 are recessed, so that top portions of semiconductor layers 110 and 134 are higher than the top surfaces of STI regions 126. The recessing of STI regions 126 may include a chemical etch process, for example, using ammonia ($NH_3$) in combination with hydrofluoric acid (HF) or nitrogen trifluoride ($NF_3$) as reaction solutions either with or without plasma. When HF is used as the reaction solution, a dilution ratio of HF may be between about 1:50 to about 1:100. Liner 124 in NMOS region 202 may also be recessed to be substantially level with recessed STI regions 126. After recessing, top surface and sidewalls of semiconductor layers 110 and 134 in fins 116 are be exposed. Channel regions 136 (e.g., exposed portions of semiconductor layers 110 and 134 along cross-section A-A) are thus formed in fins 116. In the completed finFET structure, a gate wraps around and covers sidewalls of such channel regions 136 (see e.g., FIGS. 1 and 17A). Due to the inclusion of APT layer 108, channel regions 136 in at least NMOS region 202 may be undoped and be substantially free of any dopants because APT layer 108 is formed without an APT implantation processes, for example.

Figure 12A:
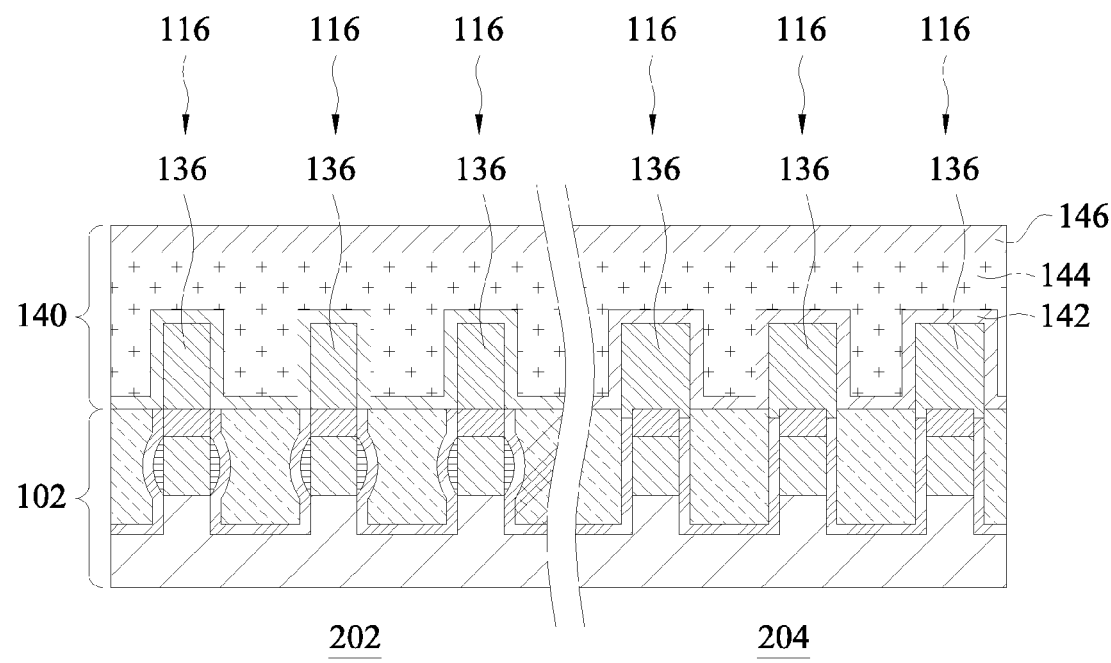
Figure 12B:
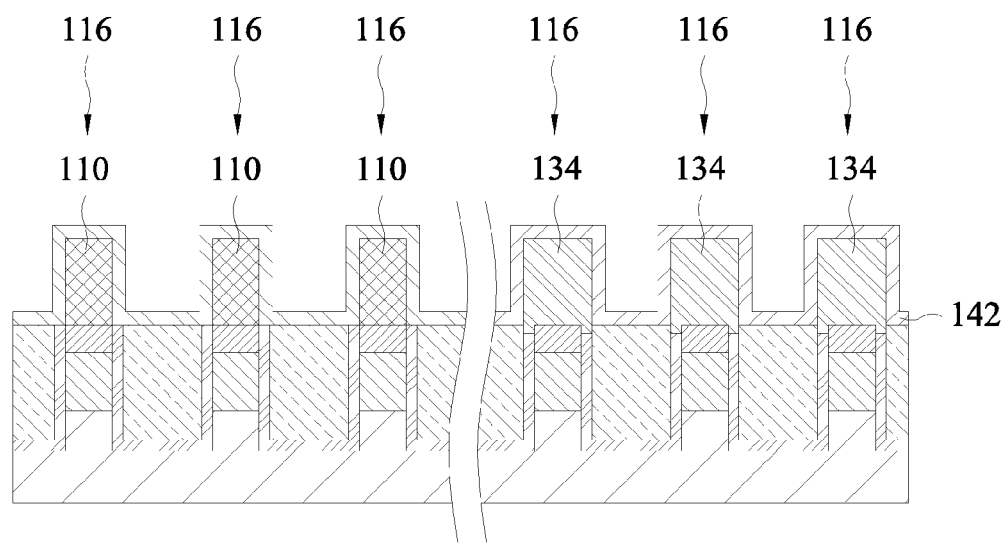
Figure 12C:
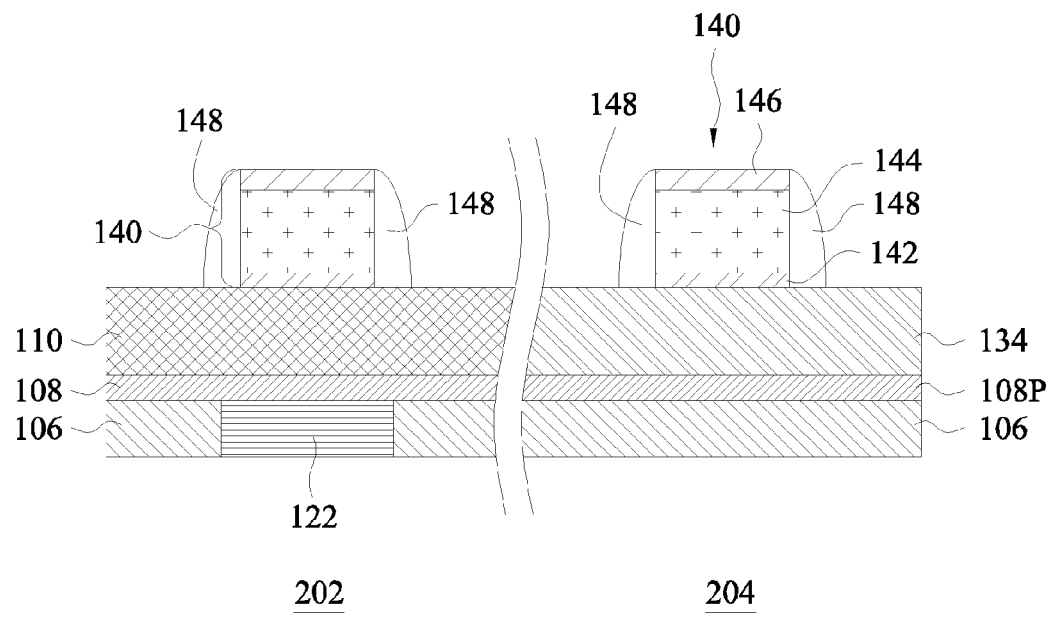

FIGS. 12A through 12C illustrate the formation of a gate stack 140 on a top surface and the sidewalls of channel region 136. Gate stacks 140 include a conformal dummy oxide 142 and a dummy gate 144 over dummy oxide 142. Dummy gate 144 may comprise, for example, polysilicon, although materials such as metal silicides, metal nitrides, or the like, may also be used. Each gate stack 140 may further include a hard mask 146 over dummy gate 144. Hard mask 146 may include silicon nitride or silicon oxide, for example. Each gate stack 140 may cross over a plurality of semiconductor fins 116 and/or STI regions 126 in some embodiments. Gate stacks 140 may also have a lengthwise direction substantially perpendicular to the lengthwise direction of semiconductor fins 116 (see e.g., FIG. 1). The formation of gate stacks 140 may further include forming dummy oxide 142 over sidewalls and a top surface of fins 116 (e.g., over exposed portions of semiconductor layers 110 and 134) in source/drain regions of fins 116 as illustrated by FIG. 12B.

As also shown in FIG. 12C, gate spacers 148 are formed on the sidewalls of gate stacks 140. In some embodiments, gate spacers 148 are formed of silicon oxide, silicon nitride, silicon carbon nitride, or the like. Furthermore, gate spacers 148 may have a multi-layer structure, for example, with a silicon nitride layer over a silicon oxide layer.

Figure 13A:
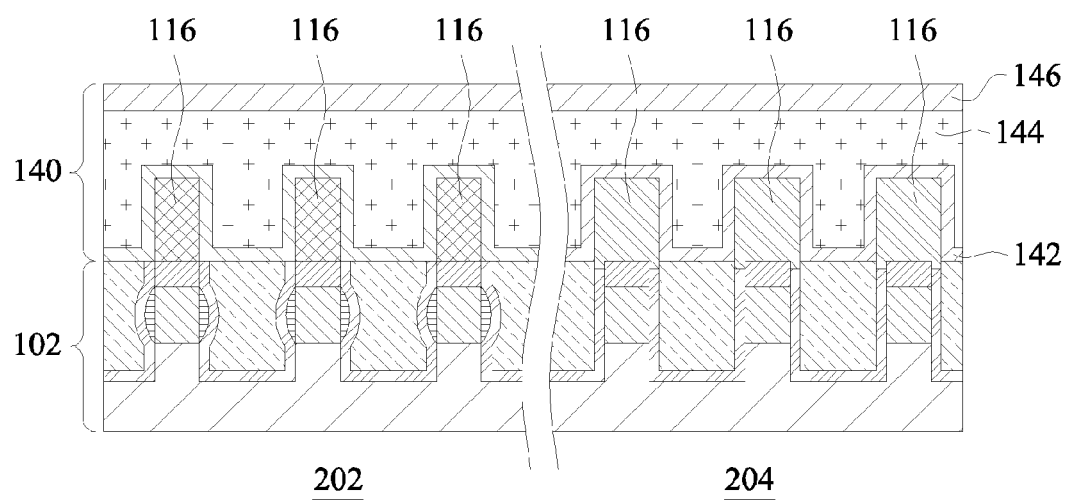
Figure 13B:
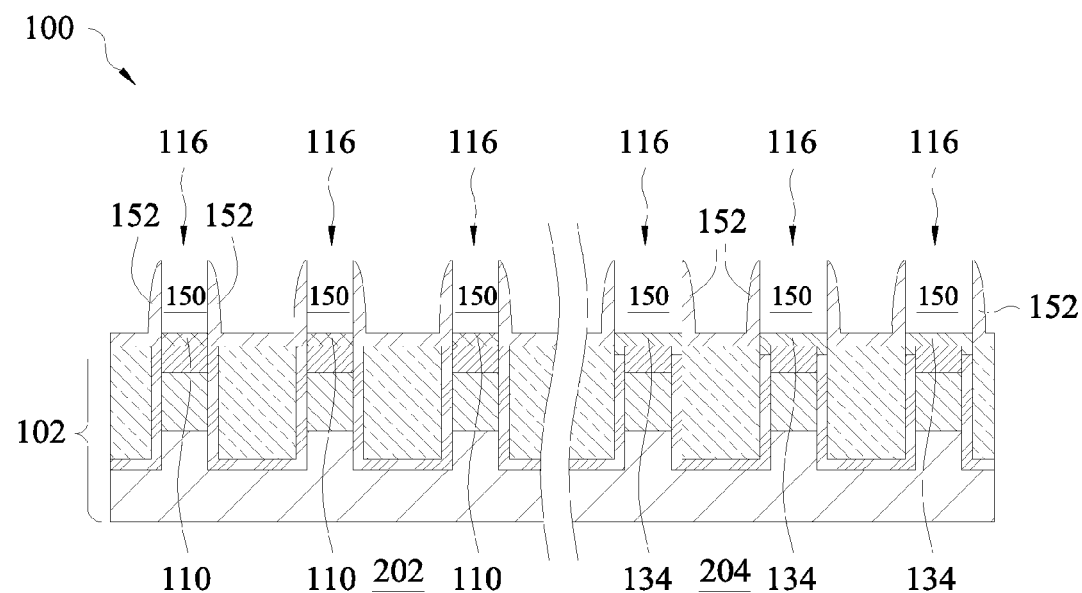
Figure 13C:
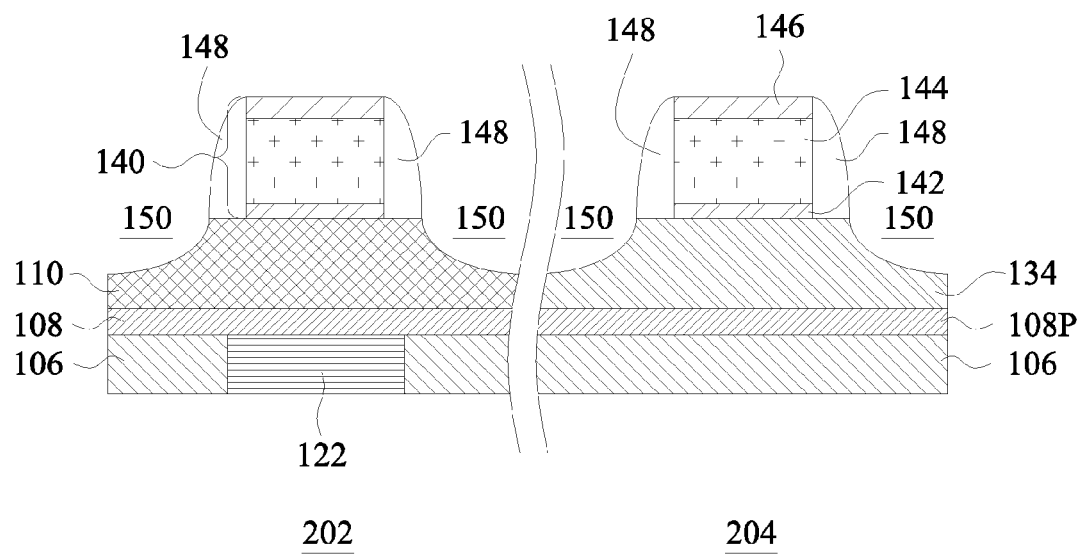

Referring to FIGS. 13A through 13C, an etching is performed to etch portions of semiconductor fins 116 that are not covered by hard mask 146 or gate spacers 148. The etching may further remove portions of dummy oxide 142 not covered by hard mask 146, which may correspond to portions of dummy oxide 142 over semiconductor layers 110 and 134 in source/drain regions of fins 116 (see FIG. 13B). After etching, remaining portions of dummy oxide 142 may be used as major sidewall (MSW) spacers 152 for defining source/drain epitaxy areas in subsequent process steps. Alternatively, fins 116 may be recessed past a top surface of STI regions 126, and exposed sidewalls of STI regions 126 may be used to define source/drain epitaxy regions. In such embodiments, spacers 152 may be omitted. Trenches 150 are accordingly formed between adjacent spacers 152. Trenches 150 are located on opposite sides of dummy gate stack 140 (see FIG. 13C). After the formation of trenches 150, a lightly doped drain (LDD) and annealing processes may be performed on exposed surfaces of fins 116 (e.g., recessed semiconductor layers 110 and 134). Although trenches 150 are illustrated as exposing a recessed surface of semiconductor layers 110 and 134, in alternative embodiments, trenches 150 may further expose underlying APT layers 108 and 108P.

Figure 14A:
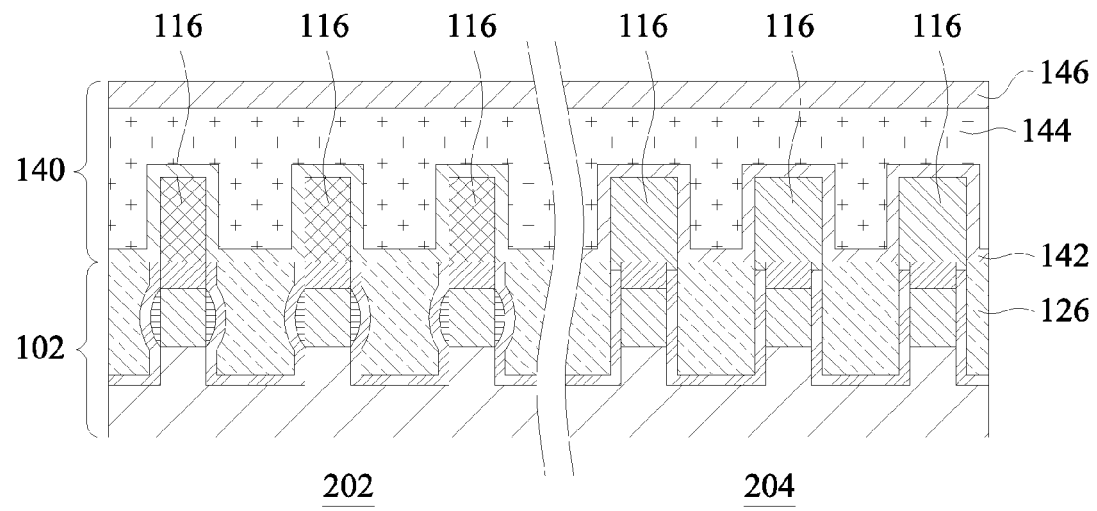
Figure 14B:
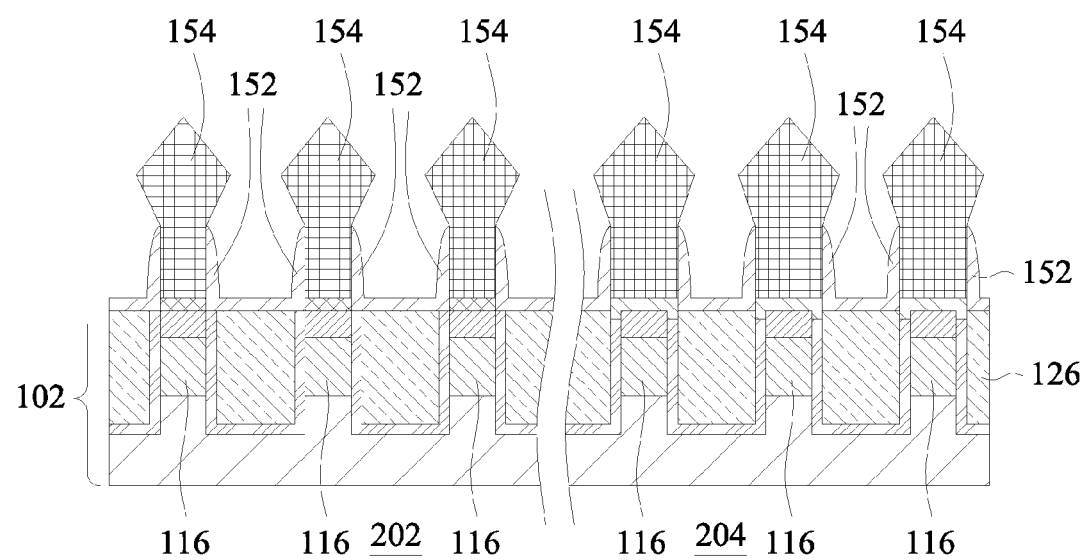
Figure 14C:
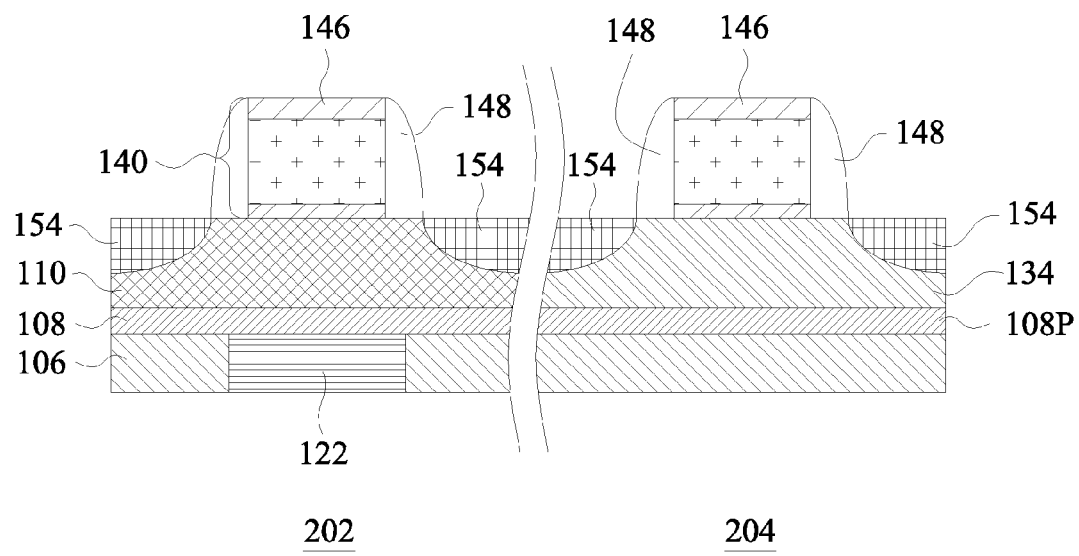

Next, as shown in FIGS. 14A through 14C, epitaxy regions 154 are formed by selectively growing a semiconductor material in trenches 150. In some embodiments, epitaxy regions 154 include silicon (with no germanium), germanium (with no silicon), silicon germanium, silicon phosphorous, or the like. Epitaxy regions 154 may also be formed of pure or substantially pure germanium, for example, with a germanium atomic percentage greater than about 95%. Hard mask 146 and spacers 152 may mask areas of wafer 100 to define an area for forming epitaxy regions 154 (e.g., only on exposed portions of fins 116). After trenches 150 are filled with epitaxy regions 154, the further epitaxial growth of source/drain regions 154 causes epitaxy regions 154 to expand horizontally, and facets may start to form. Furthermore, some portions of STI regions 126 may be underlying and aligned to portions of epitaxy regions 154 due to the lateral growth of source/drain regions 154.

After the epitaxy step, epitaxy regions 154 may be implanted with p-type impurities (e.g., boron or $BF_2$) in PMOS region 204 and n-type impurities (e.g., phosphorous or arsenic) in NMOS region 202 to form source/drain regions, which are also denoted using reference numeral 154. Alternatively, the p-type or n-type impurity may be in-situ doped when epitaxy regions 154 are grown to form source/drain regions. Source/drain regions 154 are on the opposite sides of gate stack 140 (see FIG. 14C), and may be overlying and overlapping portions of surfaces of STI regions 126 (see FIG. 14B). Furthermore, APT layers 108/108P having APT dopants of an appropriate type (e.g., n-type APT dopants in NMOS region 202 and p-type APT dopants in PMOS region 204) underlies source/drain regions 154, and APT layers 108/108P may prevent or at least reduce source/drain punch through.

Figure 15A:
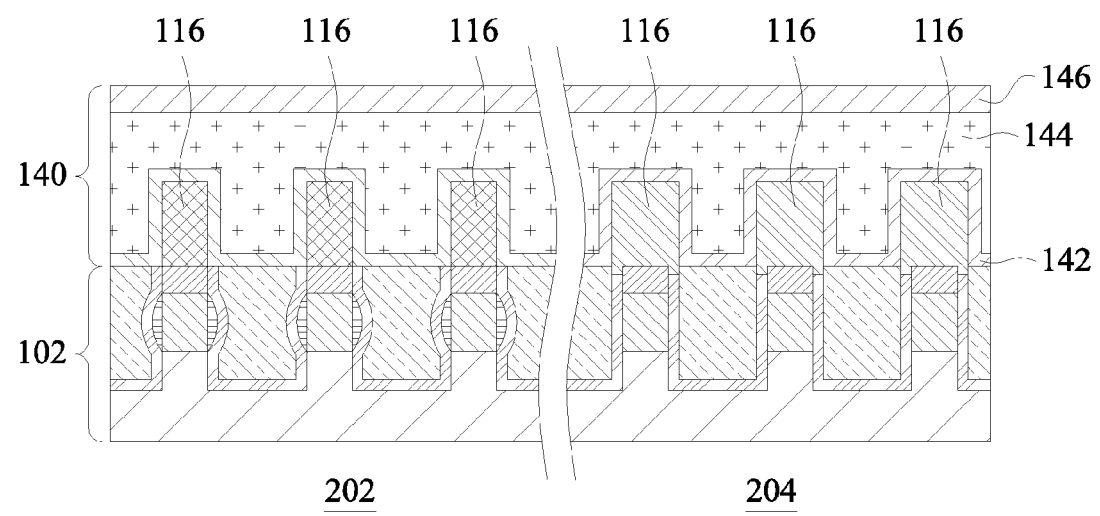
Figure 15B:
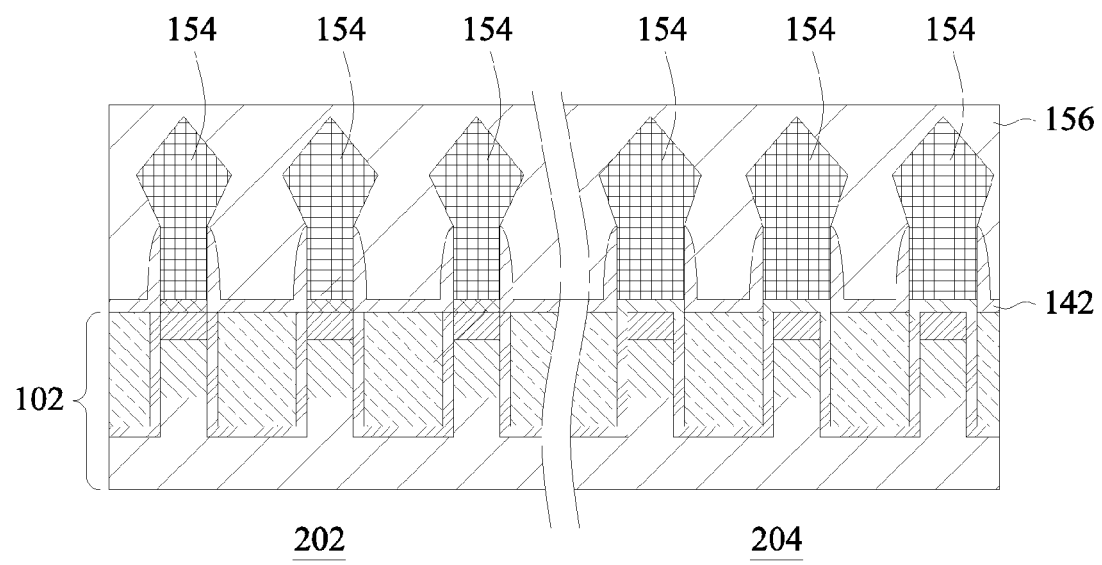
Figure 15C:
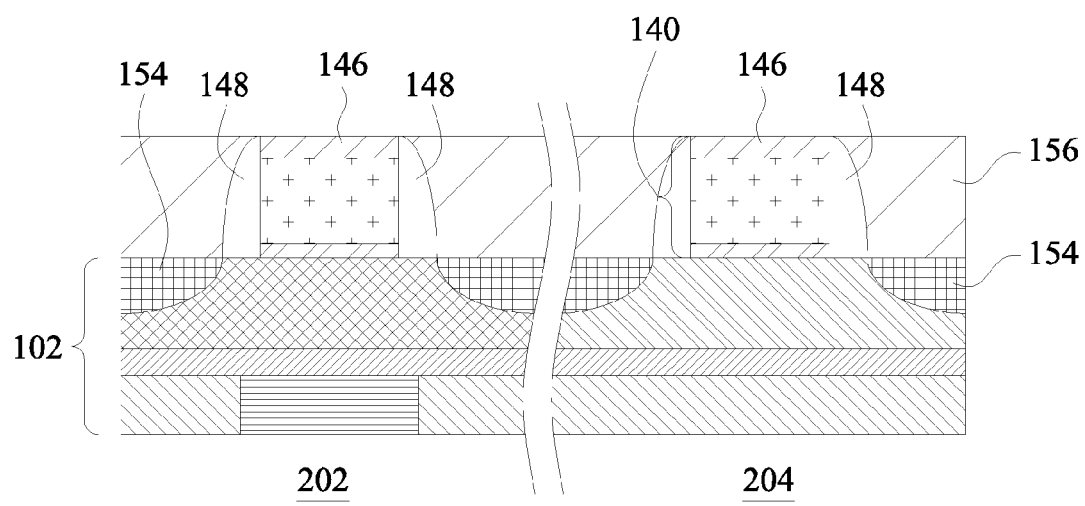

FIGS. 15A through 15C illustrate wafer 100 after interlayer dielectric 156 is formed. ILD 156 may comprise flowable oxide formed using, for example, flowable chemical vapor deposition (FCVD). A CMP (or other suitable planarization process) may be performed to level the top surfaces of ILD 156, gate stack 140, and gate spacers 148 with each other. Although not shown in detail in FIGS. 15A through 15C, various intermediary layers (e.g., buffer layers and/or etch stop layers) may be disposed between ILD layer 156 and source/drain regions 154, gate stack 140, and/or gate spacers 148.

Figure 16A:
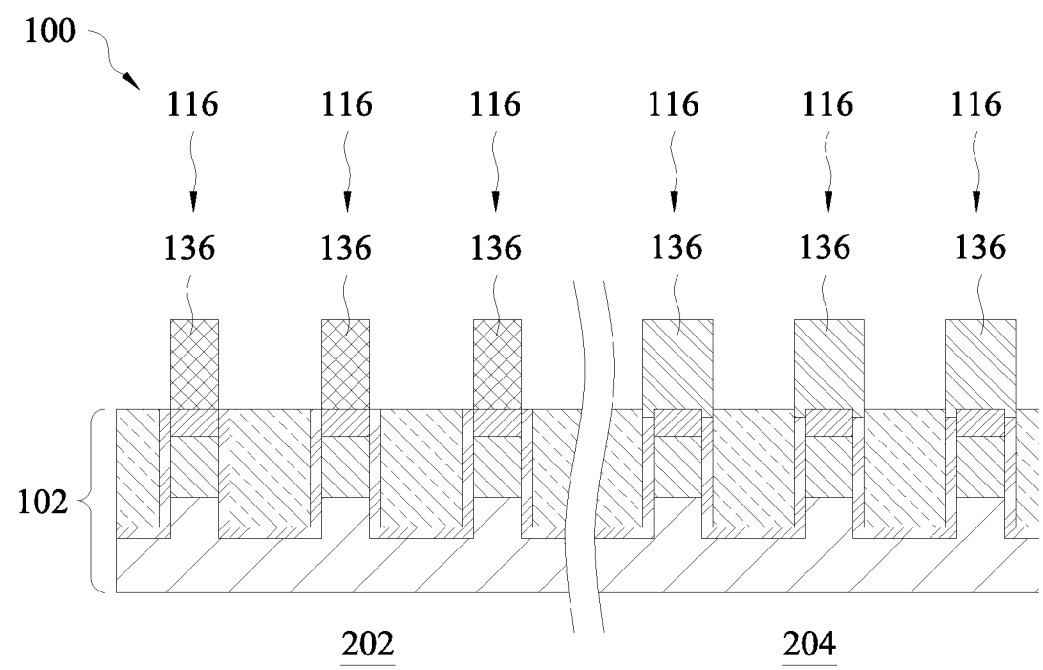
Figure 16B:
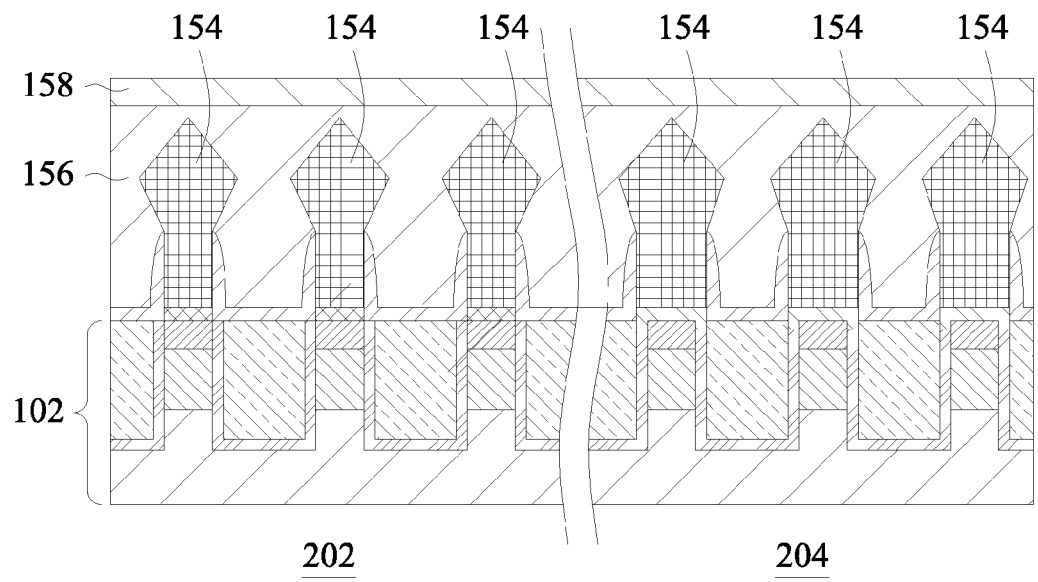
Figure 16C:
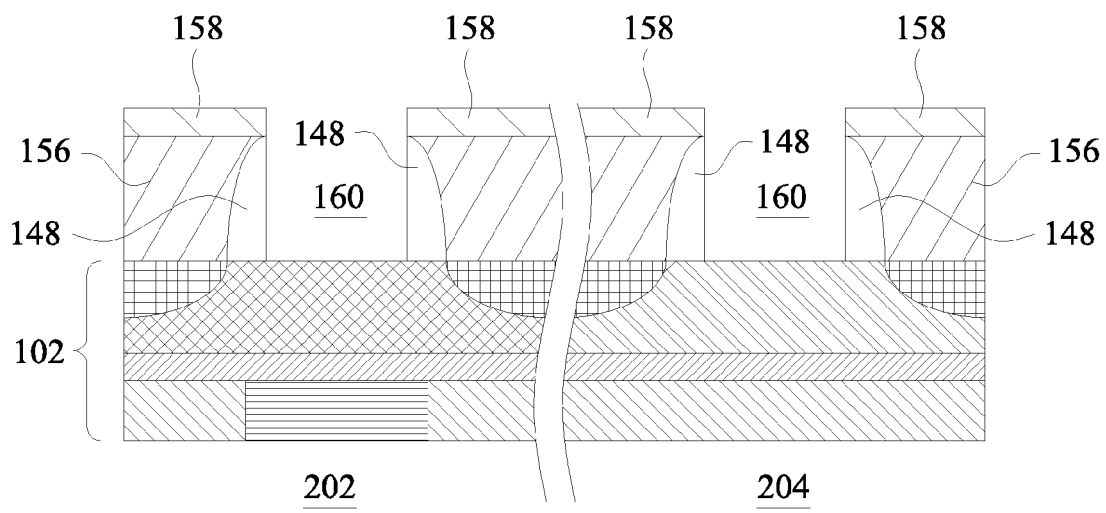

FIGS. 16A through 16C illustrate varying views of wafer 100 after exposing channel regions 136 of fins 116. Exposing channel regions 136 may include removing gate stack 140 (including hard mask 146, dummy gate 144, and dummy oxide 142) from sidewalls and top surfaces of channel regions 136. The removal of gate stack 140 may define trench 160 between gate spacers 148 (see FIG. 16C). A hard mask 158 may be used to mask ILD 156 and source/drain regions 154 during the removal of gate stack 140. Thus, gate stack 140 may be removed without patterning ILD 156 or source/drain regions 154.

Next, referring to FIGS. 17A through 17B, a gate stack 162 is formed in trenches 160. For example, a gate dielectric 164 is formed as a conformal layer in trenches 160. Gate dielectric 164 may cover top surfaces and the sidewalls of channel regions 136 (see FIG. 17A). In accordance with some embodiments, gate dielectric 164 includes silicon oxide, silicon nitride, or multilayers thereof. In alternative embodiments, gate dielectric 164 includes a high-k dielectric material. In such embodiments, gate dielectric 164 may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of gate dielectric 164 may include molecular beam deposition (MBD), ALD, plasma enhanced CVD (PECVD), or the like.

Next, a conductive gate electrode 166 is formed over gate dielectric 164 by filling remaining portions of trench 160 with a conductive material. Gate electrode 166 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like. The formation of gate dielectric 164 and gate electrode 166 may overflow trench 160 and cover a top surface of ILD 156. Subsequently, a planarization (e.g., a CMP) is performed to remove the excess portions of gate dielectric 164 and gate electrode 166. The resulting remaining portions of gate dielectric 164 and gate electrode 166 form a gate stack 162 over a channel region 136 of the resulting finFETs. Additional features, such as source/drain contacts 168, for example, comprising nickel (Ni), tungsten (W), or the like may then be formed in ILD 156 using any suitable process to electrically connect with source/drain regions 154.

FIG. 18 illustrates an example process flow 300 for forming semiconductor devices (e.g., finFETs) in accordance with some embodiments. In step 302, an APT layer (e.g., APT layer 108) is epitaxially grown in a semiconductor substrate (e.g., substrate 102). The APT layer may include APT dopants of a first type. For example, in some embodiments, the APT layer may comprise n-type APT dopants, and in such embodiments the APT layer may comprise SiB or SiCB. In step 304, a first semiconductor layer (e.g., semiconductor layer 110) is formed over the APT layer using any suitable process, such as, performing an additional epitaxy. The first semiconductor layer may be substantially free of any dopants, and at least a portion of the first semiconductor layer may be used as a channel region (e.g., channel region 136) of a resulting finFET.

Next, in step 306, first and second fins (e.g., fins 116 in NMOS region 202 and PMOS region 204) are patterned extending upwards from the semiconductor substrate. Each fin may include a first semiconductor layer portion and an APT layer portion. In step 308, the APT layer portions of the second fins are exposed by removing the first semiconductor layer portions of the second fins, for example. In step 310, APT dopants of a different type are implanted in the APT layer portions of the second fins. For example, the APT dopants implanted in step 310 may include p-type APT dopants when the original APT layer contains n-type APT dopants. In some embodiments, step 310 may include implanting APT dopants at a sufficiently high concentration to suppress the APT dopants native to the APT layer. After implantation, the APT layer in the second fins may comprise SiBP or SiCBP, for example. In step 312, a second semiconductor layer (e.g., semiconductor layer 134) is formed over the APT in the second fins.

In various embodiments, the first fins (e.g., fins 116 of NMOS region 202) are masked during steps 308 through 312. Thus, the first fins may still include the first semiconductor layer, which may remain substantially undoped. Finally, in step 314, conductive gate stacks are formed on a top surface and sidewalls of the first and second fins. For example, the conductive gate stacks may be formed on a top surface and sidewalls of the first semiconductor layer portions of the first fins and on the second semiconductor layer portions of the second fins. Additional features, such as source/drain regions may also be formed adjacent the conductive gate stack, and the APT layer may be disposed under such source/drain regions to prevent (or at least reduce) source/drain punch through in the resulting finFET devices.

Various embodiments include epitaxially growing an APT layer in a semiconductor substrate. The APT layer provides in-situ APT dopants, which may prevent punch through of n-type and p-type dopants from source/drain regions into underlying semiconductor layers of various finFET devices. An additional semiconductor layer may be formed over the APT layer, and portions of the additional semiconductor layer may be used as channel regions of the resulting finFET devices. The inclusion of an APT layer having native APT dopants eliminates APT implantation in at least devices of a first type (e.g., n-type or p-type) in the fins of such finFET devices, which may result in undoped channel regions and improved electrical functionality. APT dopant implantation may still be performed to form devices of a second type (e.g., the other of n-type or p-type) in the wafer.

In accordance with an embodiment, a semiconductor device includes a fin extending upwards from a semiconductor substrate. The fin includes an anti-punch through (APT) layer having APT dopants and a channel region over the APT layer. The channel region is substantially free of APT dopants. The semiconductor device further includes a conductive gate stack on a sidewall and a top surface of the channel region.

In accordance with another embodiment, a semiconductor device includes a first finFET and a second finFET. The finFET includes a first anti-punch through (APT) layer having first APT dopants of a first type, a first semiconductor layer over the first APT layer, a first conductive gate stack on sidewalls and a top surface of the first semiconductor layer, and first source and drain regions adjacent the first conductive gate stack. The second finFET includes a second APT layer having second APT dopants of the first type and third APT dopants of a second type different than the first type. The second finFET further includes a second semiconductor layer over the second APT layer, a second conductive gate stack on sidewalls a top surface of the second semiconductor layer, and second source and drain regions adjacent the second conductive gate stack.

In accordance with yet another embodiment, a method for forming a semiconductor device includes epitaxially growing an anti-punch through (APT) layer over a semiconductor substrate and forming a semiconductor layer over the APT layer. The APT layer includes first APT dopants. The semiconductor layer and the APT layer are patterned to define a fin extending upwards from the semiconductor substrate. The first fin includes a first APT layer portion and a first semiconductor layer portion. The method further includes forming a conductive gate stack on a top surface and a sidewall of the first semiconductor layer portion of the first fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    forming an anti-punch through (APT) layer over a semiconductor substrate, wherein the APT layer comprises first APT dopants;
    forming a semiconductor layer over the APT layer;
    patterning the semiconductor layer and the APT layer to define:
        a first fin extending upwards from the semiconductor substrate, wherein the first fin comprises a first APT layer portion and a first semiconductor layer portion over the first APT layer portion; and
        a second fin comprising a second APT layer portion and a second semiconductor layer portion over the second APT layer portion;
    implanting second APT dopants in the second APT layer portion after forming the second semiconductor layer portion, wherein the second APT dopants are of a different type than the first APT dopants; and
    forming a conductive gate stack on a top surface and a sidewall of the first semiconductor layer portion of the first fin.

2. The method of claim 1, wherein the semiconductor layer is substantially free of any APT dopants.

3. The method of claim 1 further comprising:
    prior to implanting the second APT dopants, removing the second semiconductor layer portion to expose a surface of the second APT layer portion substantially parallel to a major surface of the semiconductor substrate.

4. The method of claim 1 further comprising masking the first fin while implanting the second APT dopants.

5. The method of claim 1, wherein implanting the second APT dopants comprises implanting at least about twice as many of the second APT dopants as the first APT dopants in the second APT layer portion.

6. The method of claim 1, wherein the second APT layer portion comprises silicon boron phosphorous (SiBP) or silicon carbon boron phosphorous (SiCBP) after implanting the second APT dopants.

7. The method of claim 1, wherein forming the APT layer comprises epitaxially growing a layer comprising silicon boron or silicon carbon boron.

8. The method of claim 1 further comprising forming source and drain regions in the first fin adjacent the conductive gate stack, wherein the first APT layer portion is disposed under the source and drain regions.

9. A method comprising:
    patterning first fin extending upwards from a substrate, wherein the first fin comprises:
        a first anti-punch through (APT) portion comprising first APT dopants; and
        a first semiconductor portion over the first APT portion;
    patterning second fin extending upwards from a substrate, wherein the second fin comprises:
        a second anti-punch through (APT) portion comprising second APT dopants of a same type as the first APT dopants; and
        a second semiconductor portion over the second APT portion;
    masking the first fin;
    while masking the first fin, removing the second semiconductor portion to expose the second APT portion;
    while masking the first fin, implanting third APT dopants of a different type than the second APT dopants into the second APT portion after removing the second semiconductor portion; and
    after implanting the third APT dopants, forming a third semiconductor portion over the second APT portion.

10. The method of claim 9, wherein implanting third APT dopants comprises implanting at least twice as many third APT dopants as the second APT dopants.

11. The method of claim 9, wherein the first semiconductor portion is substantially free of APT dopants.

12. The method of claim 9, wherein the first APT dopants and the second APT dopants comprise silicon carbon boron or silicon boron.

13. The method of claim 12, wherein the first APT dopants and the second APT dopants comprise silicon carbon boron having an atomic concentration of carbon of about 0.5% to about 1%.

14. The method of claim 9, wherein the third APT dopants comprise phosphorous, and wherein after implanting the third APT dopants, the second APT portion comprises silicon carbon boron phosphorous or silicon boron phosphorous.

15. The method of claim 9, wherein patterning the first fin and patterning the second fin comprises:
    forming an APT layer comprising the first APT dopants and the second APT dopants over a first semiconductor layer;
    after forming the APT layer, forming a second semiconductor layer over the APT layer; and patterning the APT layer and the second semiconductor layer to form a first fin and a second fin.

16. A method for forming a semiconductor device, the method comprising:
   forming an anti-punch through (APT) layer over a semiconductor substrate, wherein the APT layer comprises first APT dopants;
   forming a semiconductor layer over the APT layer;
   patterning the semiconductor layer and the APT layer to define:
      a first fin extending upwards from the semiconductor substrate, wherein the first fin comprises a first APT layer portion and a first semiconductor layer portion over the first APT layer portion; and
      a second fin comprising a second APT layer portion and a second semiconductor layer portion over the second APT layer portion;
   implanting second APT dopants in the second APT layer portion after forming the second semiconductor layer portion, wherein the second APT dopants are of a different type than the first APT dopants, and wherein a ratio of the second APT dopants in the second APT layer portion to the first APT dopants in the second APT layer portion is at least two to one; and
   forming a conductive gate stack on a top surface and a sidewall of the first semiconductor layer portion of the first fin.

17. The method of claim 16, wherein a first semiconductor layer portion of the semiconductor layer over the first APT layer portion is substantially free of any APT dopants.

18. The method of claim 16 further comprising removing a second semiconductor layer portion of the semiconductor layer over the second APT layer portion to expose the second APT layer portion before implanting the second APT dopants in the second APT layer portion.

19. The method of claim 18 further comprising after implanting the second APT dopants in the second APT layer portion, forming an additional semiconductor layer over the second APT layer portion.

20. The method of claim 16 further comprising masking the first fin while implanting the second APT dopants in the second APT layer portion.

* * * * *